(12) United States Patent
Yoshida

(10) Patent No.: US 9,207,376 B2
(45) Date of Patent: *Dec. 8, 2015

(54) ILLUMINATION APPARATUS, IMAGE SENSOR UNIT, IMAGE READING APPARATUS, AND IMAGE FORMING APPARATUS

(71) Applicant: CANON COMPONENTS, INC., Kodama-gun, Saitama (JP)

(72) Inventor: Hidemasa Yoshida, Saitama (JP)

(73) Assignee: CANON COMPONENTS, INC. (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/595,605

(22) Filed: Jan. 13, 2015

(65) Prior Publication Data

US 2015/0122979 A1  May 7, 2015

Related U.S. Application Data

(63) Continuation of application No. 13/940,909, filed on Jul. 12, 2013, now Pat. No. 8,964,265.

(30) Foreign Application Priority Data

Jul. 13, 2012 (JP) .................. 2012-158073
Jul. 9, 2013 (JP) .................. 2013-143999

(51) Int. Cl.
*H04N 1/04* (2006.01)
*F21V 8/00* (2006.01)
(Continued)

(52) U.S. Cl.
CPC ............. *G02B 6/0005* (2013.01); *G01J 1/0422* (2013.01); *G01J 1/42* (2013.01); *G02B 6/001* (2013.01);
(Continued)

(58) Field of Classification Search
CPC .... G02B 6/0005; G02B 6/001; G02B 6/0096; G01J 1/0422; H04L 27/14601; H04N 1/02815; H04N 1/02845
USPC ......... 358/484, 475, 509, 512–514, 482, 483; 399/220, 221; 355/67–71; 250/208.1, 250/234–236, 239, 216
See application file for complete search history.

(56) References Cited

U.S. PATENT DOCUMENTS

| 6,017,130 A | 1/2000 | Saito et al. |
| 8,681,398 B2 | 3/2014 | Shimoda et al. |

(Continued)

FOREIGN PATENT DOCUMENTS

JP            10-126581 A       5/1998

OTHER PUBLICATIONS

Office Action issued in U.S. Appl. No. 13/940,909, mailed Jun. 3, 2014.

(Continued)

*Primary Examiner* — Cheukfan Lee
(74) *Attorney, Agent, or Firm* — Rossi, Kimms & McDowell LLP

(57) ABSTRACT

An illumination apparatus includes: a light guide that is formed in a rod shape and includes a positioning portion that is formed at one end in a longitudinal direction, and light incident surfaces that are formed at two end faces in the longitudinal direction; and light sources that are arranged in the vicinity of the light incident surfaces, respectively, and that emit light that is incident on the incident surfaces. The light guide is formed by injection molding. A gate portion for supplying a resin material during injection molding opens at a position that corresponds to a tip face of the positioning portion.

10 Claims, 16 Drawing Sheets

(51) Int. Cl.
*H01L 27/146* (2006.01)
*H04N 1/028* (2006.01)
*G01J 1/04* (2006.01)
*G01J 1/42* (2006.01)
*H04N 1/10* (2006.01)

(52) U.S. Cl.
CPC ........ *G02B 6/0096* (2013.01); *H01L 27/14601* (2013.01); *H04N 1/02815* (2013.01); *H04N 1/02845* (2013.01); *H04N 1/10* (2013.01); *G02B 6/0065* (2013.01); *H04N 2201/0081* (2013.01)

(56) References Cited

U.S. PATENT DOCUMENTS 8,964,265 B2 * 2/2015 Yoshida .................. 358/484
2013/0141766 A1 6/2013 Iwamatsu et al.

OTHER PUBLICATIONS

Notice of Allowance issued in U.S. Appl. No. 13/940,909, mailed Oct. 14, 2014.

* cited by examiner

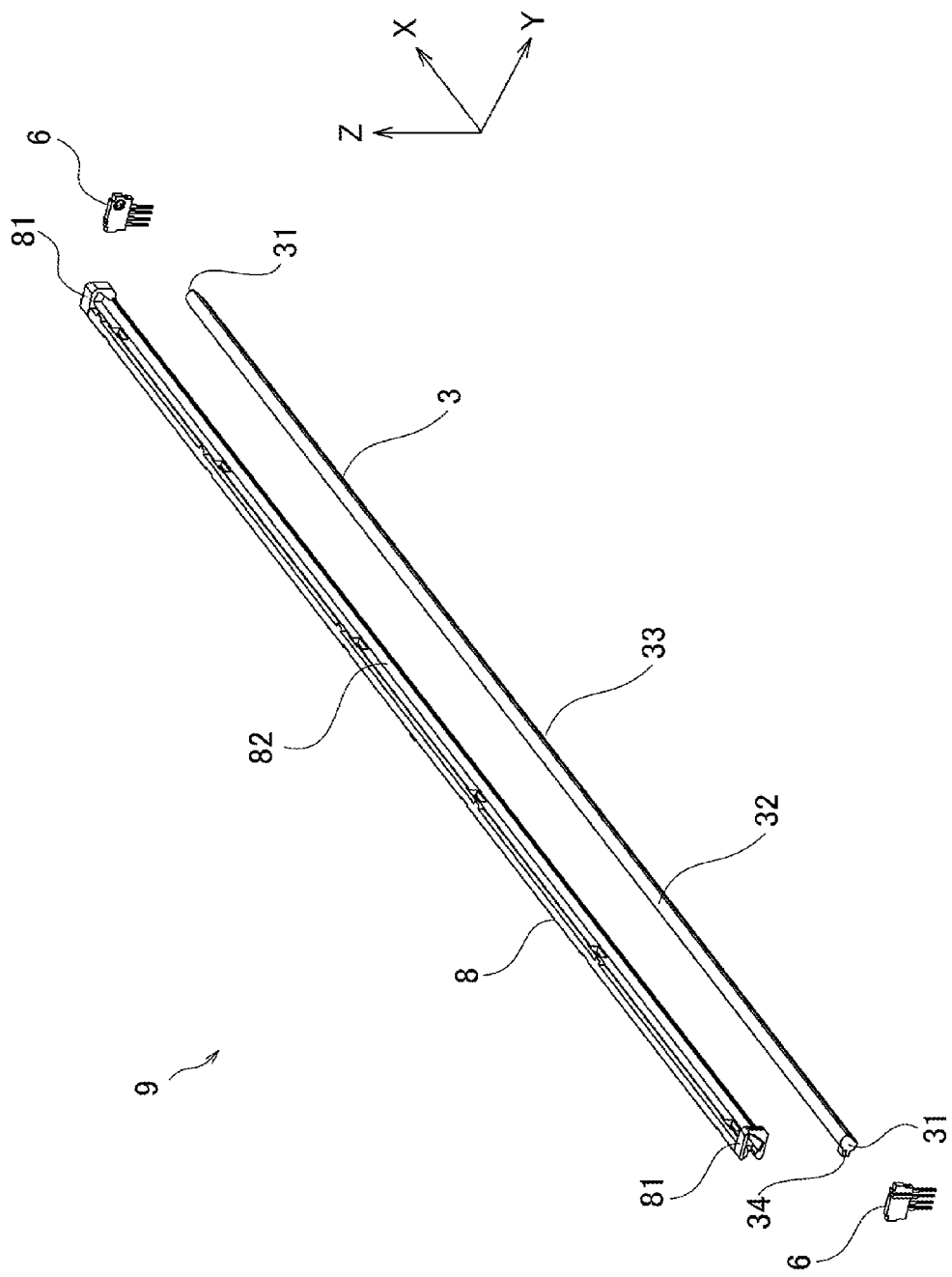

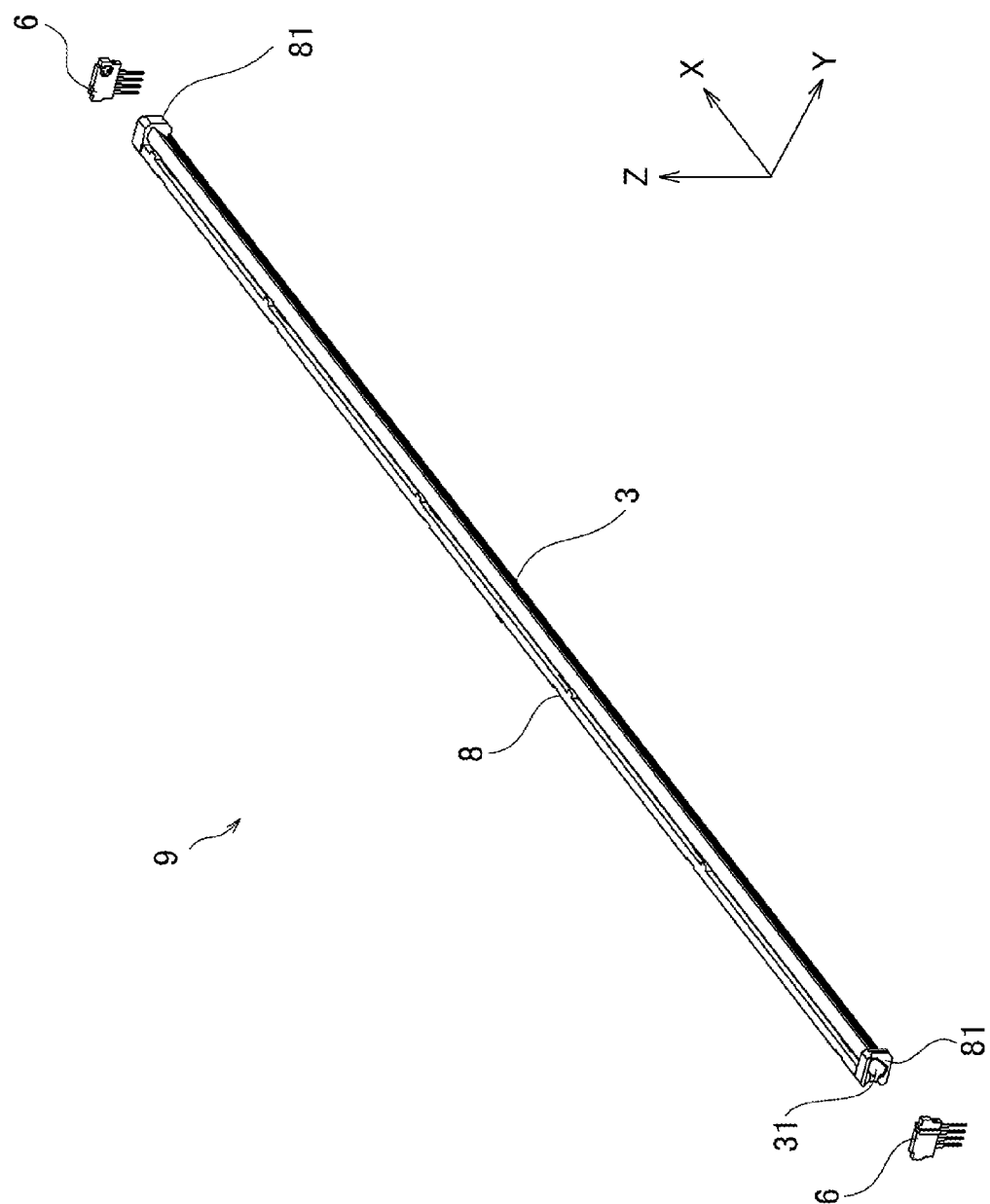

ILLUMINATION APPARATUS, IMAGE SENSOR UNIT, IMAGE READING APPARATUS, AND IMAGE FORMING APPARATUS

CROSS-REFERENCE TO RELATED APPLICATIONS

This application is based upon and claims the benefit of priority of the prior Japanese Patent Application No. 2012-158073, filed on Jul. 13, 2012, and the Japanese Patent Application No. 2013-143999, filed on Jul. 9, 2013, the entire contents of which are incorporated herein by reference.

BACKGROUND OF THE INVENTION

1. Field of the Invention

The present invention relates to an illumination apparatus, an image sensor unit, an image reading apparatus, and an image forming apparatus.

2. Description of the Related Art

Some illumination apparatuses that are used in image sensor units have a configuration in which a point light source is converted into a line light source through a rod-like light guide. A light guide that is applied in such an illumination apparatus is generally made of a resin material such as an acrylic resin and is formed by injection molding. A gate portion (sprue portion), which serves as an inflow port for a resin material when performing injection molding, is cut (gate cut) with hot nippers or the like after the injection molding to thereby detach the light guide. In this configuration, projections and recesses may be caused by the cutting on the gate-cut surface (cut surface at the gate portion). In such case, the optical properties may become unstable at the projections and recesses and leak light may arise from the projections and recesses, resulting in an uneven luminance distribution of the illumination light.

Consequently, a configuration has been proposed in which a gate portion is provided at a location away from a portion that emits light to an object of illumination. For example, Patent Document 1 discloses a configuration in which a light source is provided at one end of a light guide in an illumination apparatus, and a gate portion for injection molding is provided at the other end.

In this connection, there is a demand to increase the light quantity of an illumination apparatus to improve the reading speed of the image sensor unit. A common method to increase the light quantity of an illumination apparatus is to provide light sources at opposite ends of a light guide. However, according to the configuration described in Patent Document 1, since a gate portion is provided at the other end face in the longitudinal direction, the problem is that the necessity arises to smoothen projections and recesses that arise on the gate-cut surface by grinding or the like, which leads to an increase in the production costs.

Patent Document 1: Japanese Laid-open Patent Publication No. 10-126581

SUMMARY OF THE INVENTION

In view of the circumstances described above, an object of the present invention is to provide a uniform luminance distribution of illumination light in a configuration in which a light source is provided at opposite ends in a longitudinal direction of a light guide.

An illumination apparatus according to the present invention includes: a light guide that is formed in a rod shape, and that includes a positioning portion that is formed at one end in a longitudinal direction thereof, and light incident surfaces that are formed at two end faces in the longitudinal direction; and light sources that are arranged in a vicinity of the light incident surfaces, respectively, and that emit light that is incident on the light incident surfaces; in which: the light guide is formed by injection molding; and a gate portion that serves as an inflow port for a resin material during injection molding opens at a position that corresponds to a tip face of the positioning portion.

An image sensor unit according to the present invention includes: a light guide that is formed in a rod shape, and that includes a positioning portion that is formed at one end in a longitudinal direction thereof, and light incident surfaces that are formed at two end faces in the longitudinal direction; light sources that are arranged in a vicinity of the light incident surfaces, respectively, and that emit light that is incident on the light incident surfaces; a light condenser that focuses reflection light from an object of illumination; an image sensor that receives reflection light that is focused by the light condenser, and converts the reflection light into an electric signal; a circuit board on which the image sensor is mounted; and a frame that supports the light guide, the light sources, the light condenser, and the circuit board; in which: the light guide is formed by injection molding; and a gate portion that serves as an inflow port for a resin material during injection molding opens at a position that corresponds to a tip face of the positioning portion.

An image reading apparatus according to the present invention reads reflection light from an object of illumination while relatively moving an image sensor unit and the object of illumination with respect to each other, in which the image sensor unit is the image sensor unit according to the present invention.

An image forming apparatus according to the present invention includes: image reading means that reads reflection light from an object of illumination while relatively moving an image sensor unit and the object of illumination with respect to each other; and image forming means that forms an image on a recording medium; in which the image sensor unit is the image sensor unit according to the present invention.

BRIEF DESCRIPTION OF THE DRAWINGS

FIG. 1 is an exploded perspective view that schematically illustrates a configuration of an illumination apparatus;

FIG. 3 is an external perspective view that schematically illustrates a state in which a light guide cover is attached to the light guide;

DETAILED DESCRIPTION OF THE PREFERRED EMBODIMENTS

Figure 2A:
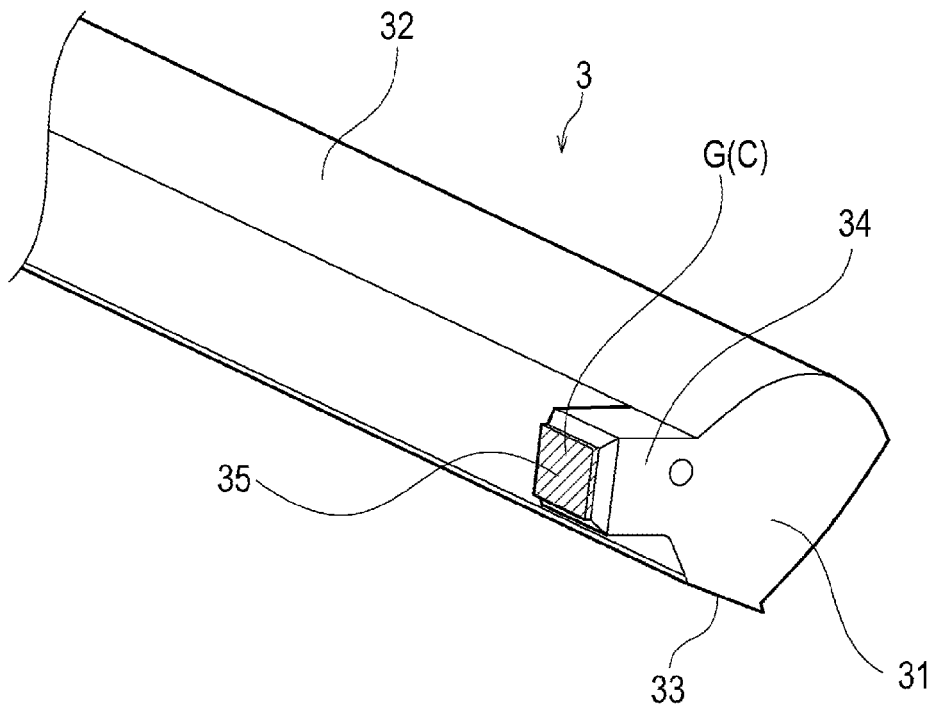
FIG. 2A is a view that schematically illustrates a configuration in a vicinity of one end in a main-scan direction (longitudinal direction) of a light guide.

Embodiments that can apply the present invention will now be described in detail with reference to the drawings. The embodiments of the present invention are an illumination apparatus, an image sensor unit that includes the illumination apparatus, and an image reading apparatus and an image forming apparatus that include the image sensor unit. In each of the drawings, three-dimensional directions are indicated by X, Y, and Z arrows. The X direction denotes a main-scan direction of the image sensor unit. The Y direction denotes a sub-scan direction of the image sensor unit. The Z direction denotes a vertical direction of the image sensor unit. The image sensor unit that is an embodiment of the present invention emits light to an original P as an object of illumination by means of an illumination apparatus while moving in the sub-scan direction relative to the original P, and reads an image from the original P by means of the reflection light.

(Illumination Apparatus)

First, the configuration of an illumination apparatus 9 will be described.

FIG. 1 is an exploded perspective view that schematically illustrates the configuration of the illumination apparatus 9. As illustrated in FIG. 1, the illumination apparatus 9 includes a light guide 3, a light guide cover 8, and light sources 6.

The light guide 3 is an optical member that converts light that the light sources 6 emit into a line light source. The light guide 3 is made of a transparent resin material, such as an acrylic resin, and is integrally formed by injection molding.

As illustrated in FIG. 1, the overall structure of the light guide 3 is a rod-shaped structure that is long and thin in the main-scan direction.

The two end faces in the main-scan direction (longitudinal direction) of the light guide 3 are light incident surfaces 31 upon which light that the light sources 6 emit is incident.

A light emission surface 32 and a light diffusing surface 33 are formed on side surfaces of the light guide 3.

The light emission surface 32 is a surface that emits light that is incident from the light incident surface 31 towards the original P. The light emission surface 32 is formed in a long and thin band shape that extends in the main-scan direction. The light emission surface 32 is formed, for example, into a curved surface that is convex in the direction of a reading line O (see FIG. 10) of the original P to emit illumination light towards the reading line O of the original P.

The dimension in the main-scan direction of the light emission surface 32 is set according to the width (main-scan direction dimension) of the original P. For example, when adopting a configuration that corresponds to reading of an A4-size original P, the dimension in the main-scan direction of the light emission surface 32 is set to a dimension that is in accordance with the width of the A4-size original P.

The light diffusing surface 33 is a surface that reflects and diffuses light incident from the light incident surface 31. The light diffusing surface 33 is formed so as to face the light emission surface 32. For example, a plurality of prism-like diffusing portions are formed at required intervals on the light diffusing surface 33. The intervals between the plurality of diffusing portions are large at opposite ends in the main-scan direction and are small at a center part in the main-scan direction.

The diffusing portion may be, for example, a printed pattern of a light reflective paint created by silk screen printing or the like. In this case also, similarly to the aforementioned configuration, the density of the printed pattern is gradually changed in accordance with a distance from the light sources 6 into a low density at a section close to the light sources 6 and into a high density at a section that is far from the light sources 6. The other peripheral surfaces of the light guide 3 each serve as a reflection surface that reflects light.

Figure 2B:
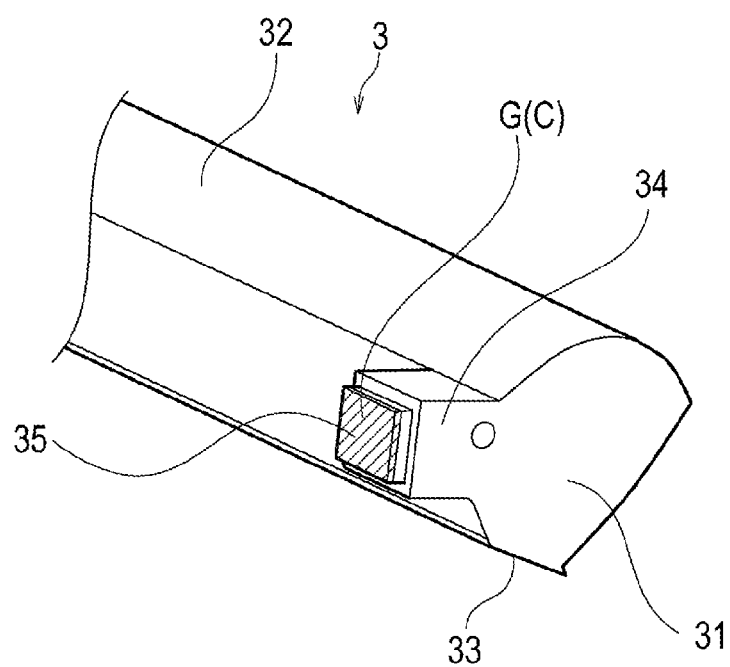
FIG. 2B is a view that schematically illustrates another example of a configuration in the vicinity of one end in the main-scan direction of the light guide.

FIG. 2A and FIG. 2B are views that schematically illustrate a configuration in the vicinity of one end in the main-scan direction of the light guide 3. Note that FIG. 2B illustrates another example in which one part is different from the configuration shown in FIG. 2A.

As illustrated in FIG. 2A and FIG. 2B, a positioning portion 34 is formed at one end in the main-scan direction of the light guide 3. The positioning portion 34 is a portion for defining (positioning) the relative positional relationship with the light guide cover 8. At this time, at least one peripheral surface of the positioning portion 34 excluding a tip face 35, described later, serves as a positioning reference surface. The positioning portion 34 has a protrusion-like structure that protrudes in a substantially perpendicular direction with respect to the main-scan direction (longitudinal direction). In FIG. 1, FIG. 2A, and FIG. 2B, a configuration is illustrated in which the positioning portion 34 protrudes to the rear side in the sub-scan direction.

As described above, the light guide 3 is formed by injection molding. A gate portion G (sprue portion) that serves as an inflow port for a resin material during injection molding opens at a position corresponding to the tip face 35 of the positioning portion 34. With this configuration, a runner and a gate that are molded by means of the gate portion G can be formed at positions that are separated from the light incident surface 31 and the light emission surface 32. Consequently, it is possible to prevent or suppress the occurrence of a situation in which the luminance distribution of illumination light becomes nonuniform that is caused by projections and recesses that arise on a gate-cut surface C when cutting (gate-cutting).

Further, according to this configuration, the gate portion G need not be provided at an end face in the main-scan direction (longitudinal direction) of the light guide 3. Consequently, both of the end faces in the main-scan direction of the light guide 3 are smooth and the optical properties are stable. Accordingly, both end faces in the main-scan direction of the light guide 3 can be used as they are as the light incident surfaces 31. Furthermore, for example, R-trimming or C-trimming (C-trimming according to an example of the present invention) is performed around the tip face 35 of the positioning portion 34, and the gate-cut surface C is provided on the tip face 35. Here, the term "R-trimming" refers to rounding corners into an arc shape, and the term "C-trimming" refers to making corners into a tapered surface.

An opening of the gate portion G may be narrower than the tip face 35. Further, as illustrated in FIG. 2B, a configuration may also be adopted in which a difference in level is provided around the tip face 35 of the positioning portion 34 or the like. In short, any configuration may be adopted as long as the configuration is one in which a space is generated between the gate-cut surface C and the positioning reference surface.

The light guide cover 8 is a member that improves the light utilization efficiency. The light guide cover 8 is formed by a material having a high light reflectance. For example, white polycarbonate in which titanium oxide powder is mixed is applied for the light guide cover 8.

The light guide cover 8 has a structure that is long in the main-scan direction, and covers at least the light diffusing surface 33. Attachment portions 81 for attaching the light guide cover 8 to the light guide 3 are provided at opposite ends in the main-scan direction (longitudinal direction). Attachment holes 811 into which the two ends of the light guide 3 can be fitted, respectively, are formed in the attachment portions 81. The attachment holes 811 are through-holes that penetrate in the main-scan direction. An engagement portion 812 that is capable of engaging with the positioning portion 34 of the light guide 3 is formed in one of the attachment portions 81. Accordingly, the respective two ends of the light guide 3 can fit into the respective attachment holes 811 of the attachment portions 81 of the light guide cover 8. In that state, the positioning portion 34 of the light guide 3 is engaged in the engagement portion 812 of the light guide cover 8. Thus, the positional relationship between the light guide cover 8 and the light guide 3 is determined. The configurations of the attachment portion 81, the attachment holes 811, and the engagement portion 812 are described in detail later.

The light guide cover 8 also has a reflection surface 82 and an urging portion 83.

The reflection surface 82 is a surface that faces the light diffusing surface 33 of the light guide 3 in a state in which the light guide cover 8 is attached to the light guide 3. The reflection surface 82 reflects light emitted to outside from the light diffusing surface 33 of the light guide 3 and causes the light to enter the inside of the light guide 3 again. For this reason, the reflection surface 82 is formed in a band shape that extends in the main-scan direction.

The urging portion 83 urges the light guide 3 into contact with a frame 2 (described later) of the image sensor unit 1 to thereby position the light guide 3 with respect to the frame 2. The urging portion 83 has a tongue-like structure elastically deformable in the sub-scan direction, and is formed integrally with the light guide cover 8.

The illumination apparatus 9 has two light sources 6. Each of the two light sources 6 emits light to the respective light incident surfaces 31 at opposite ends of the light guide 3. Each light source 6 has, for example, light emitting elements having emission wavelengths of each of the colors of red (R), green (G), and blue (B). Various well-known LEDs can be applied as the light emitting elements having emission wavelengths of the respective colors. The light source 6 is mounted on the upper surface of a circuit board 5 (described later).

The light source 6 is not limited to the above described configuration. Various well-known point light sources can be applied to the light source 6.

Figure 4A:
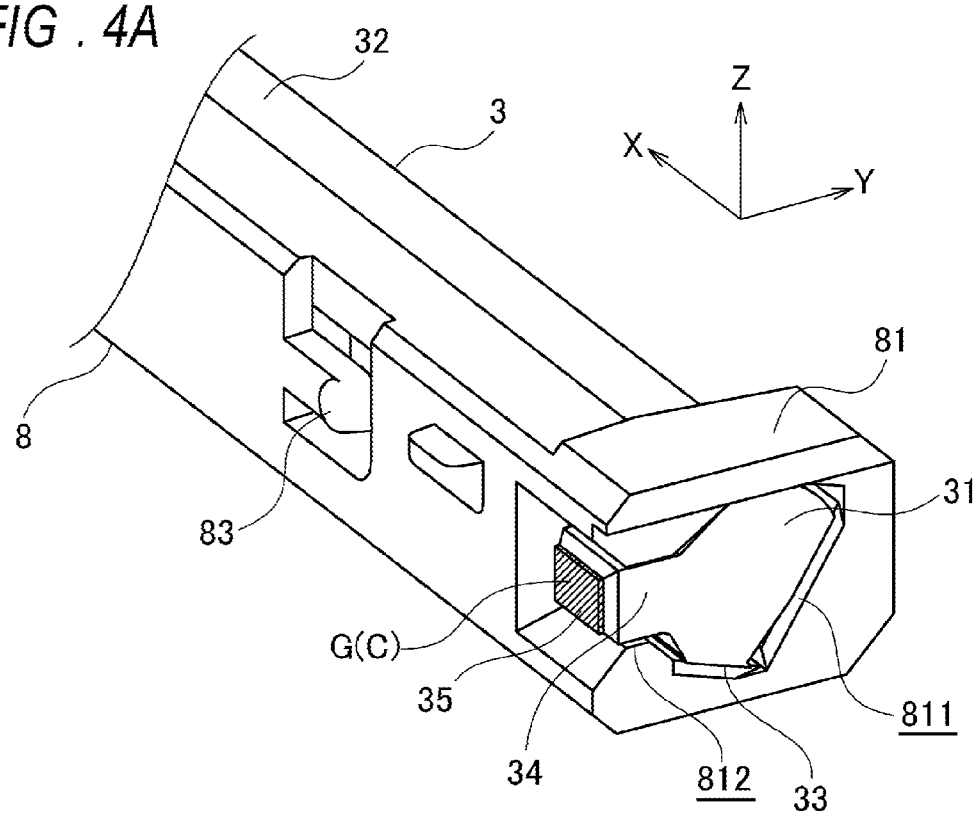
FIG. 4A is a perspective view illustrating the vicinity of an end in the main-scan direction of the light guide to which the light guide cover is attached.
Figure 4B:
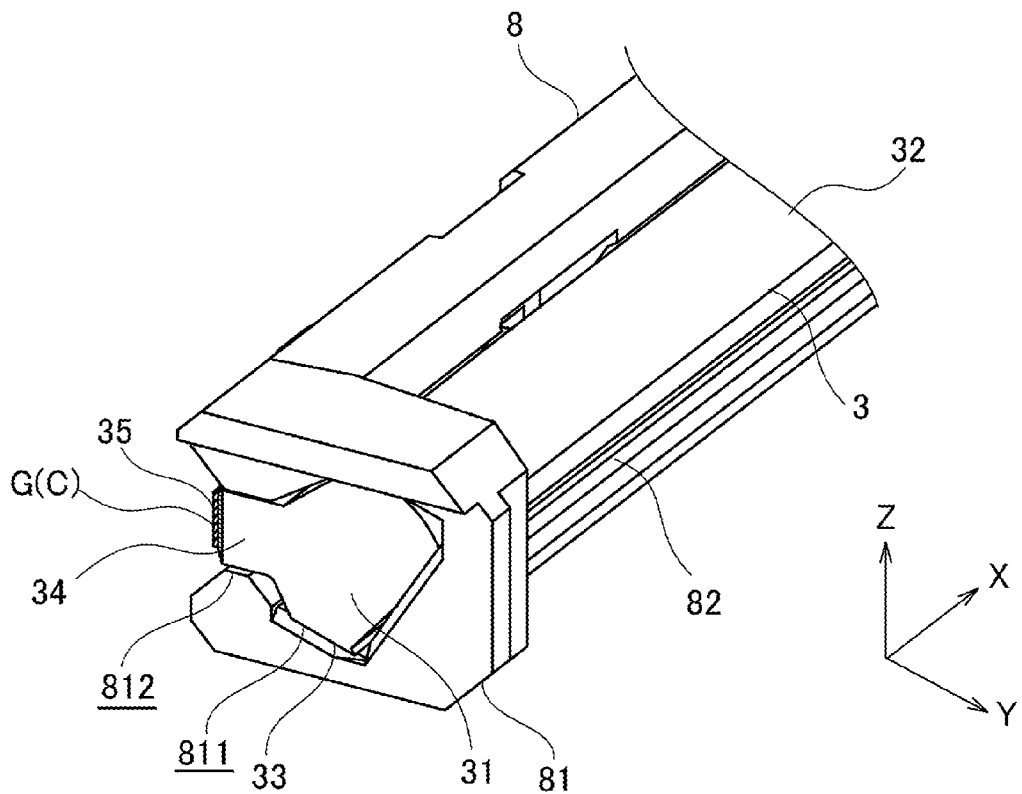
FIG. 4B is a perspective view illustrating the vicinity of the end in the main-scan direction of the light guide to which the light guide cover is attached.
Figure 5:
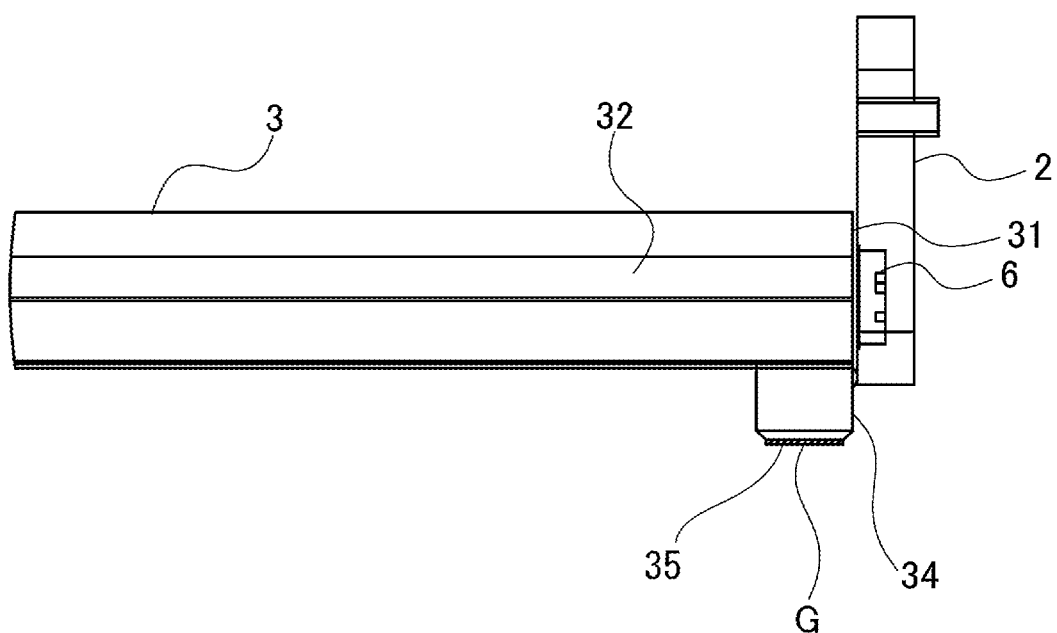
FIG. 5 is a plan view that schematically illustrates a positional relationship between the light guide and a light source.

Next, an assembly of the illumination apparatus 9 will be described with reference to FIGS. 3 to 5. FIG. 3 is an external perspective view that schematically illustrates a state in which the light guide cover 8 is attached to the light guide 3. FIG. 4A and FIG. 4B are perspective views showing the vicinity of an end in the main-scan direction of the light guide 3 to which the light guide cover 8 is attached. FIG. 4A is a view as seen from the rear side in the sub-scan direction, and FIG. 4B is a view as seen from the front side in the sub-scan direction. FIG. 5 is a plan view that schematically illustrates the positional relationship between the light guide 3 and the light source 6.

As illustrated in FIG. 3, FIG. 4A, and FIG. 4B, the light guide cover 8 is attached to the light guide 3.

Each attachment portion 81 of the light guide cover 8 has a plate-like or block-like structure that protrudes in the sub-scan direction. The attachment holes 811 that penetrate in the main-scan direction are formed in the attachment portions 81. The attachment holes 811 are formed in accordance with the sectional dimension and shape of the light guide 3 so that the ends of the light guide 3 can be inserted through the attachment holes 811.

In addition, the engagement portion 812 with which the positioning portion 34 of the light guide 3 engages is formed in one of the attachment portions 81. The engagement portion 812 is formed in the shape of a concave portion in which an end side in the main-scan direction and one side in the sub-scan direction (rear side in the example shown in the drawings) are open. The engagement portion 812 has dimensions and a shape that correspond to the positioning portion 34 of the light guide 3 so that the positioning portion 34 can be fitted therein.

At the time of attachment, an end on a side on which the positioning portion 34 of the light guide 3 is not provided is inserted from the outer side in the main-scan direction into the attachment hole 811 of the attachment portion 81 on the side on which the engagement portion 812 is formed. The light guide 3 is then slid relatively in the main-scan direction with respect to the light guide cover 8. Subsequently, the end of the light guide 3 is inserted from the center side in the main-scan direction into the attachment hole 811 of the attachment portion 81 on the side on which the engagement portion 812 is not formed. Thus, each of the two ends in the main-scan direction of the light guide 3 can be fitted into the respective attachment holes 811 of the attachment portion 81 at the two ends of the light guide cover 8. In addition, the positioning portion 34 provided at the other end of the light guide 3 can be fitted into the engagement portion 812 of the attachment portion 81.

By fitting the positioning portion 34 of the light guide 3 into the engagement portion 812 of the light guide cover 8 in this manner, the light guide 3 and the light guide cover 8 are positioned with respect to each other.

As described in the foregoing, the attachment hole 811 that is formed in the attachment portion 81 of the light guide cover

8 is a through-hole that penetrates in the main-scan direction. Therefore, in a state in which the light guide cover 8 is attached to the light guide 3, the light incident surface 31 of the light guide 3 is exposed from the attachment hole 811 of the attachment portion 81 of the light guide cover 8.

As illustrated in FIG. 5, in the vicinity of the two ends of the light guide 3, the light sources 6 are each arranged so that light emitted therefrom can be incident on the light incident surface 31. As described in the foregoing, since the light incident surface 31 of the light guide 3 is exposed, the light sources 6 can emit light that is incident on the light incident surface 31 of the light guide 3.

Further, the light diffusing surface 33 of the light guide 3 and the reflection surface 82 of the light guide cover 8 face each other. Consequently, light that is emitted to outside from the light diffusing surface 33 of the light guide 3 is reflected at the reflection surface 82 of the light guide cover 8 and enters the inside of the light guide 3 again.

According to the illumination apparatus 9 having this configuration, light that is emitted from the two light sources 6 enters the inside of the light guide 3 from the light incident surface 31. The light that enters the inside of the light guide 3 propagates through the inside thereof while being reflected at the side surfaces. Light that arrives at the light diffusing surface 33 is emitted to outside through the diffusing portion or is diffused at the diffusing portion and arrives at the light emission surface 32. The light that is emitted to outside from the light diffusing surface 33 is reflected by the reflection surface 82 of the light guide cover 8 and enters the inside of the light guide 3 again, and arrives at the light emission surface 32. The light that arrives at the light emission surface 32 is emitted towards the original P.

There are projections and recesses on the gate-cut surface C that arise as the result of cutting with hot nippers or the like. Therefore, the projections and recesses on the gate-cut surface C can act as a diffusing surface. In such case, unintended diffused light is generated, or unintended leak light to outside from the projections and recesses of the gate-cut surface C or the like arises. Therefore, in the conventional configuration in which the gate-cut surface C is directly formed on a side surface of the light guide 3, the luminance distribution of illumination light is nonuniform due to unintended reflection light and leak light from the gate-cut surface C and the like.

In contrast, the embodiment of the present invention is a structure in which the gate portion G is formed at the tip face 35 of the positioning portion 34. The positioning portion 34 has a protrusion-like structure that protrudes in a substantially perpendicular direction with respect to the main-scan direction (longitudinal direction). Therefore, the amount of light that reaches the gate-cut surface C decreases in comparison to the configuration in which the gate portion G is formed directly on a side surface of the light guide 3. Accordingly, the amount of unintended diffused light and leak light from the gate-cut surface C can be reduced, and as a result the luminance distribution in the main-scan direction of emitted illumination light can be made uniform. Further, since the periphery of the tip face 35 of the positioning portion 34 is trimmed and the gate portion G is provided on the tip face 35, a space is generated between the gate-cut surface C and the positioning reference surface. Therefore, it is possible to reduce the occurrence of a situation in which burr-like projections and recesses that arise on the gate-cut surface C reach the positioning reference surface, and also reduce a decrease in the positioning accuracy by maintaining the flatness of the positioning reference surface.

Thus, according to the present embodiment, while meeting the demand for an increase in light quantity by forming the light incident surfaces 31 at the two end faces in the main-scan direction (longitudinal direction) of the light guide 3, the luminance distribution of illumination light that is emitted can be made uniform (and formation of a nonuniform luminance distribution can be prevented or suppressed).

Figure 6A:
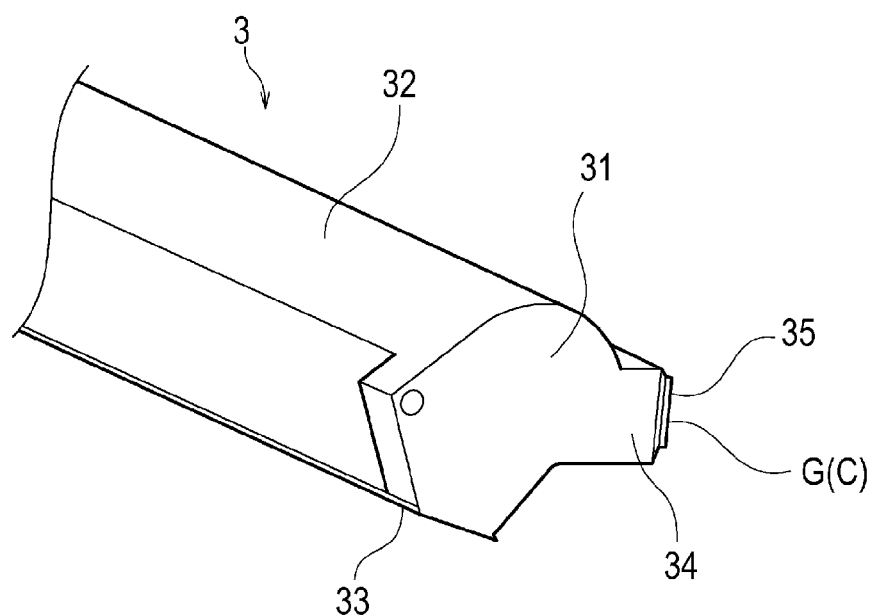
FIG. 6A is a view that illustrates an example of a configuration in which a positioning portion protrudes to an opposite side.
Figure 6B:
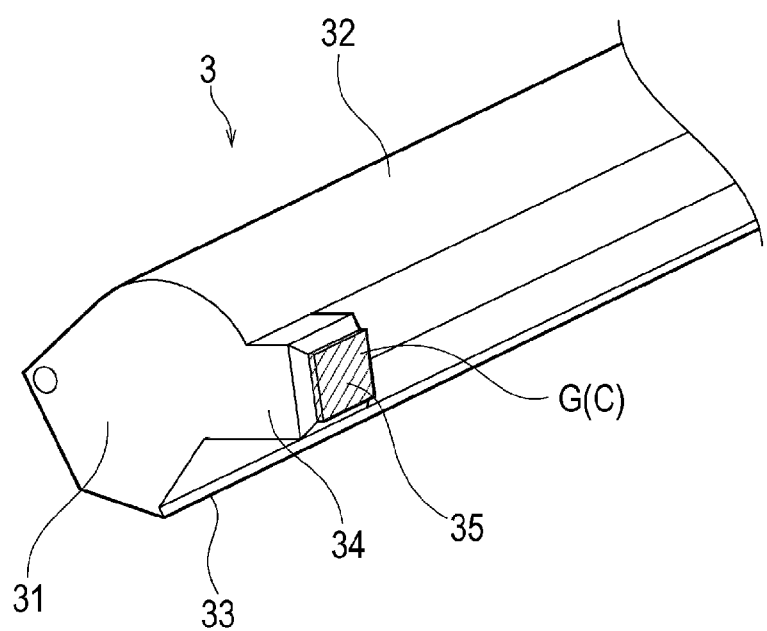
FIG. 6B is a view that illustrates an example of the configuration in which the positioning portion protrudes to the opposite side.
Figure 7A:
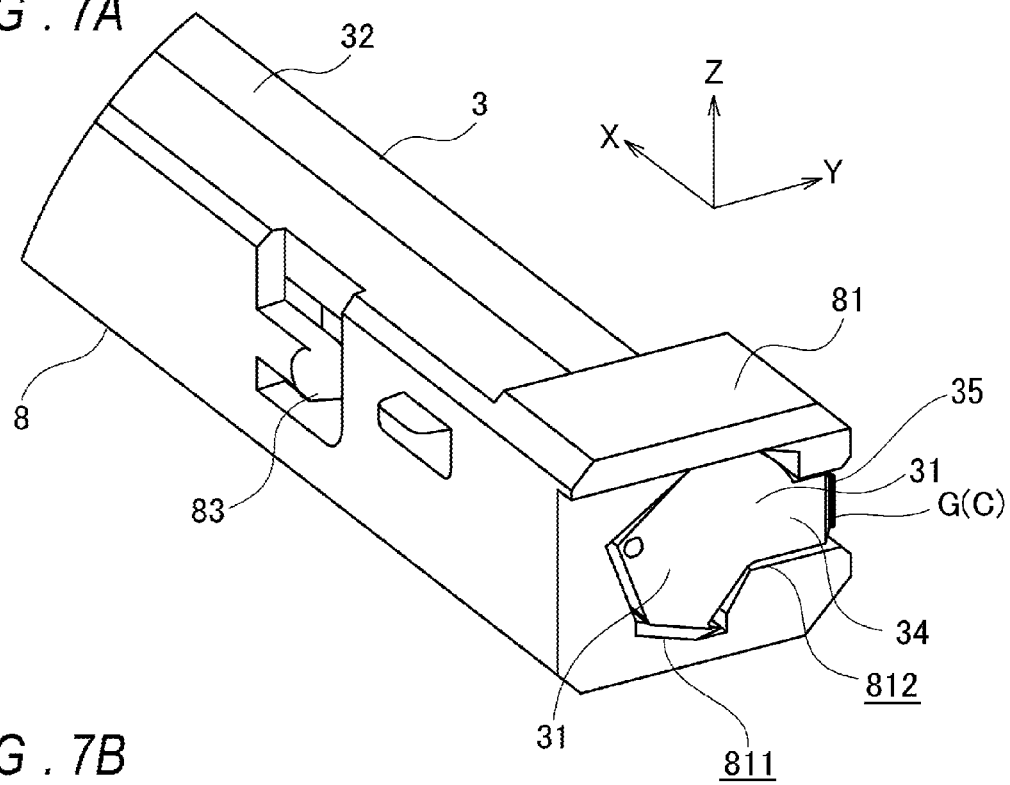
FIG. 7A is a perspective view that schematically illustrates a state in which the light guide cover is attached to the light guide, that is a view illustrating the vicinity of an end in the longitudinal direction.
Figure 7B:
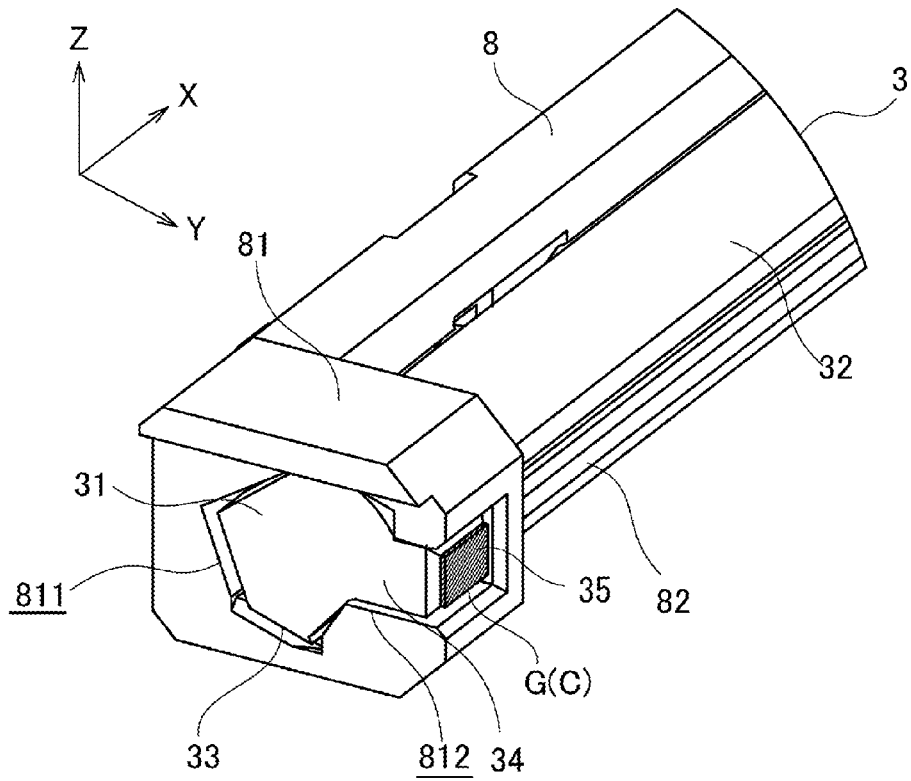
FIG. 7B is a perspective view that schematically illustrates a state in which the light guide cover is attached to the light guide, that is a view illustrating the vicinity of an end in the longitudinal direction.

Although a configuration in which the positioning portion 34 protrudes to the rear side in the sub-scan direction is described above, the protruding direction of the positioning portion 34 is not limited to the aforementioned direction. FIG. 6A and FIG. 6B are views that illustrate an example of a structure in which the positioning portion 34 protrudes to the front side in the sub-scan direction. FIG. 7A and FIG. 7B are perspective views that illustrate a state in which the light guide cover 8 is attached to the light guide 3 shown in FIG. 6A and FIG. 6B.

As illustrated in FIG. 6A and FIG. 6B, a configuration may also be adopted in which the positioning portion 34 protrudes to the front side in the sub-scan direction. The gate portion G for injection molding is provided on the tip face 35 of the positioning portion 34. Apart from the direction in which the positioning portion 34 protrudes, the configuration is the same as that described above. In this case, as illustrated in FIG. 7A and FIG. 7B, the engagement portion 812 with which the positioning portion 34 engages is formed at the front side in the sub-scan direction of the attachment hole 811. By engagement of the positioning portion 34 of the light guide 3 with the engagement portion 812 of the light guide cover 8, the light guide cover 8 is attached to the light guide 3 in a positioned state.

Further, although according to the above described embodiment a configuration is described in which the illumination apparatus 9 has the light guide cover 8, and the positioning portion 34 of the light guide 3 engages with the engagement portion 812 of the attachment portion 81 of the light guide cover 8, a configuration other than that configuration may be adopted. For example, the configuration may be one in which the illumination apparatus 9 does not have the light guide cover 8. In this case, a configuration can be applied in which an engagement portion is provided on the frame 2 of the image sensor unit 1 or the like, and the positioning portion 34 of the light guide 3 engages with the engagement portion of the frame 2.

A configuration that is the same as the configuration described above can be applied with respect to the remainder of the configuration.

Thus, a configuration may be adopted in which the positioning portion 34 protrudes to either of the front side and rear side in the sub-scan direction. The same effects are attained whether the configuration is one in which the positioning portion 34 protrudes to the front side or to the rear side.

(Image Sensor Unit)

Figure 8:
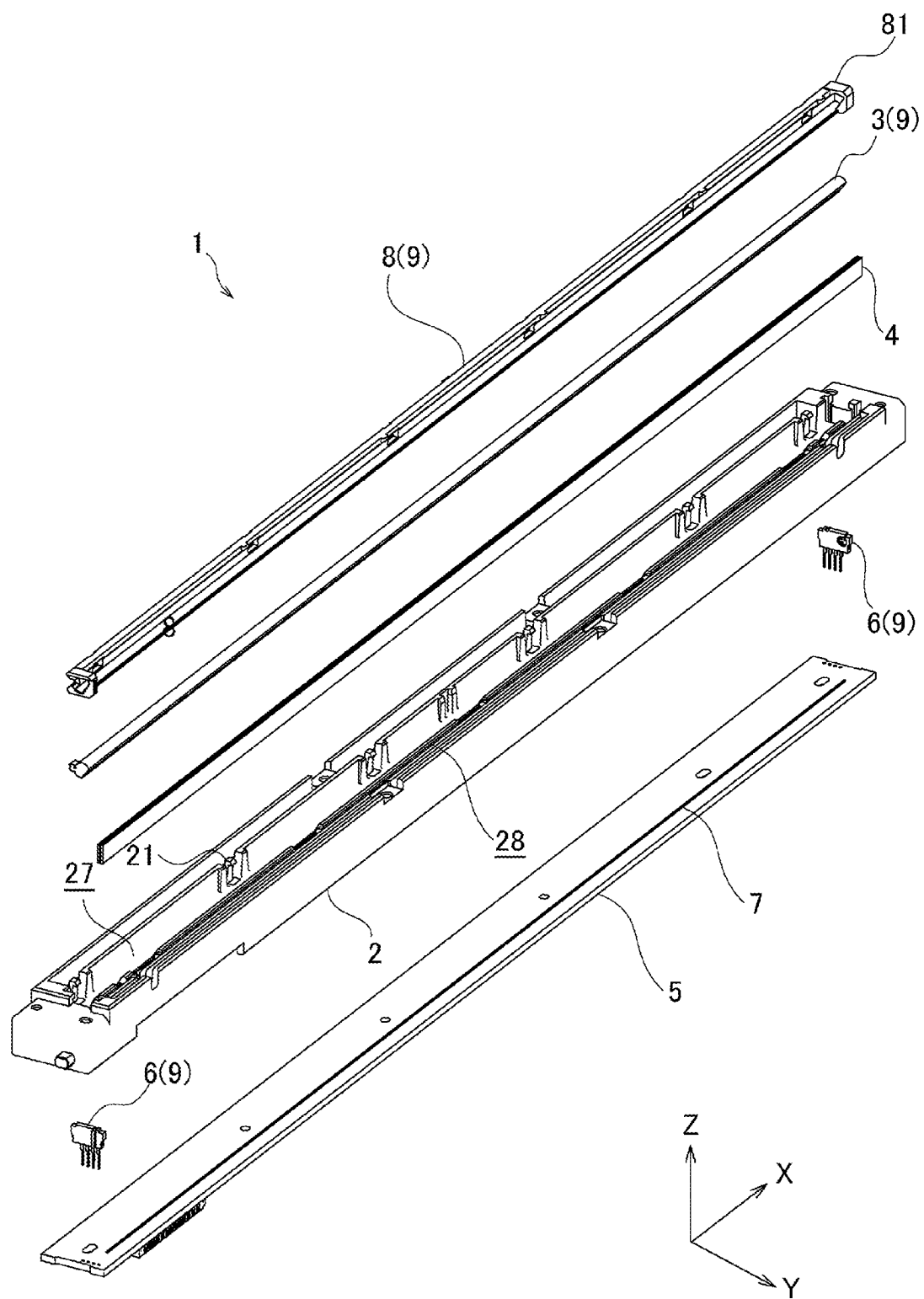
FIG. 8 is an exploded perspective view that schematically illustrates a configuration of an image sensor unit.
Figure 9:
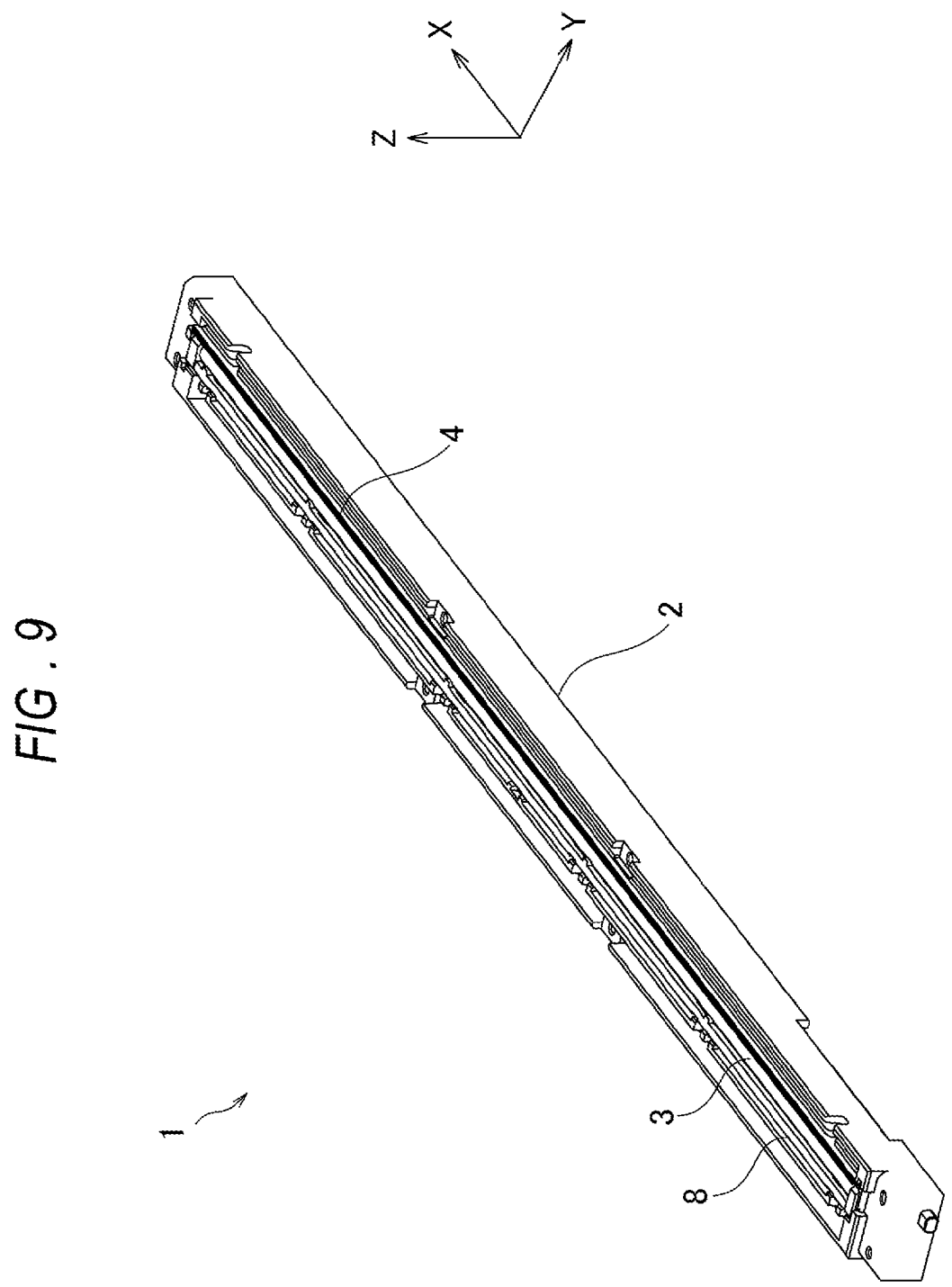
FIG. 9 is an external perspective view that schematically illustrates the configuration of the image sensor unit.
Figure 10:
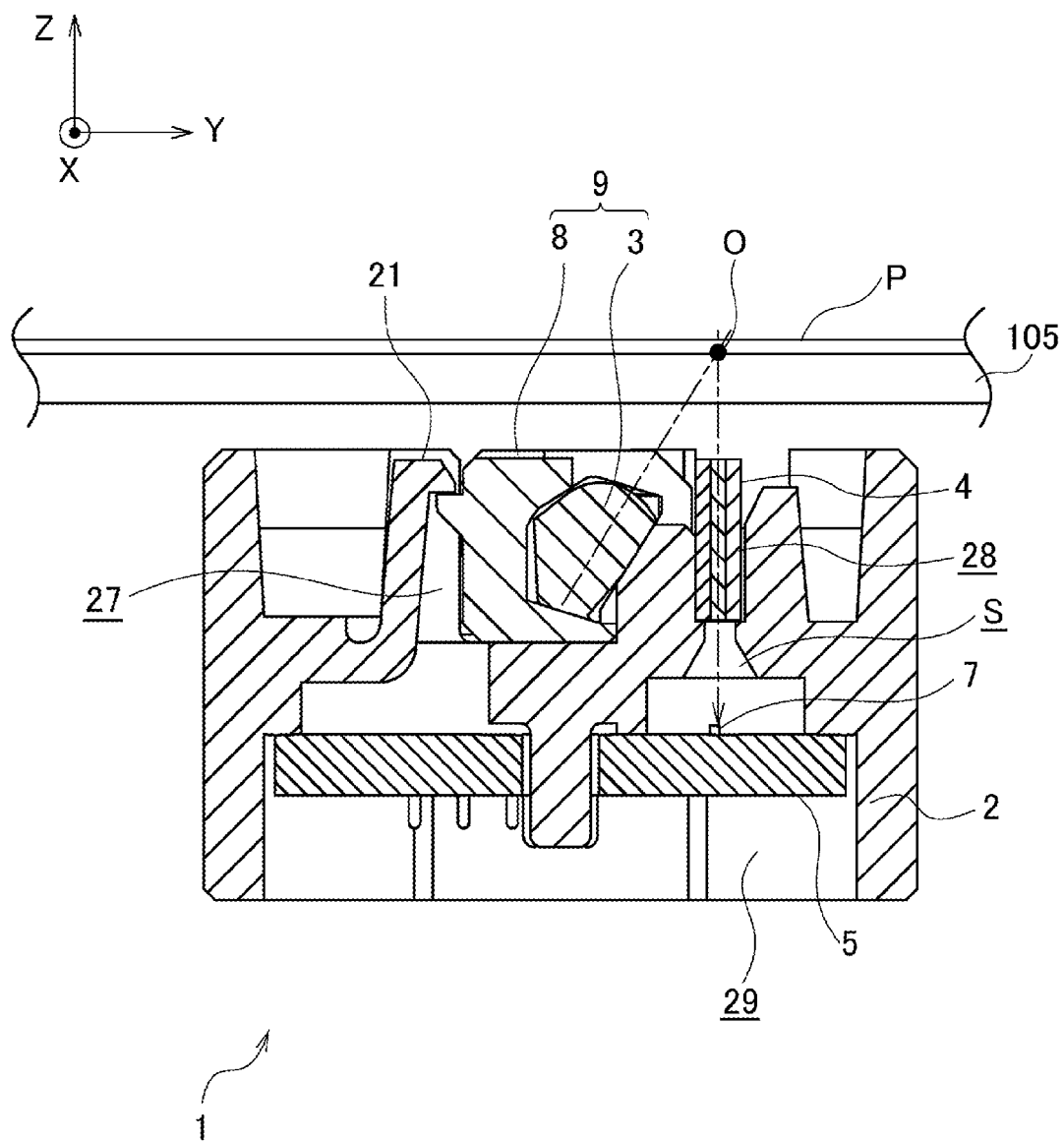
FIG. 10 is a sectional view that schematically illustrates the internal configuration of the image sensor unit.

Next, the configuration of the image sensor unit 1 will be described referring to FIG. 8 to FIG. 10. FIG. 8 is an exploded perspective view that schematically illustrates the configuration of the image sensor unit 1. FIG. 9 is an external perspective view that schematically illustrates the configuration of the image sensor unit 1. FIG. 10 is a sectional view that schematically illustrates the internal configuration of the image sensor unit 1, that is a sectional view taken along a plane perpendicular to the main-scan direction.

As illustrated in FIG. 8 to FIG. 10, the image sensor unit 1 is a rectangular solid-shaped structure that is long in the main-scan direction. The image sensor unit 1 includes the illumination apparatus 9 (the light source 6, the light guide 3, and the light guide cover 8), the frame 2, the light condenser 4, the circuit board 5, and the image sensor 7.

The frame 2 is a housing of the image sensor unit 1. The light guide 3 to which the light guide cover 8 is attached, the light condenser 4, and the circuit board 5 on which the image sensor 7 and the light source 6 are mounted are housed in and attached to the frame 2. The frame 2 is integrally formed by a light-blocking resin material that is colored in black, for example. Polycarbonate can be applied as the resin material, for example.

As illustrated in FIG. 8 and FIG. 9, the frame 2 is a substantially rectangular solid member that is long in the main-scan direction.

A light guide housing chamber 27, a light condenser housing chamber 28, and a circuit board housing chamber 29 (see FIG. 10) are formed in the frame 2. The light guide housing chamber 27 is a region that opens to the upper side, and is configured to be capable of housing the light guide 3 to which the light guide cover 8 is attached. The light condenser housing chamber 28 is a region that opens to the upper side, and is configured to be capable of housing the light condenser 4. The circuit board housing chamber 29 is a region that opens to the lower side, and is configured to be capable of housing the circuit board 5 on which the light source 6 and the image sensor 7 are mounted. An opening S that allows the light condenser housing chamber 28 and the circuit board housing chamber 29 to communicate so that light can pass therethrough is formed in the frame 2.

In addition, holding claws 21 that position and fix the light guide cover 8 that is housed in the light guide housing chamber 27 are formed in the frame 2. The light guide holding claws 21 are elastically deformable structures that protrude towards the inner side of the light guide housing chamber 27, and are formed integrally with the frame 2.

The light condenser 4 is an optical member that forms an image of the reflection light from the original P on the surface of the image sensor 7. The light condenser 4 can be, for example, a rod-lens array with a plurality of image-forming elements (rod lenses) of an erect equal magnification image-forming type linearly arranged in the main-scan direction. The configuration of the light condenser 4 is not limited as long as the configuration is one in which imaging elements are linearly arranged. For example, the light condenser 4 may have a configuration in which imaging elements are arranged in a plurality of rows. Further, the light condenser 4 can be an optical member with various well-known light condensing functions, such as various micro-lens arrays.

The image sensor 7 converts the reflection light formed into an image by the light condenser 4 into electric signals. The image sensor 7 can be, for example, an image sensor IC array. The image sensor IC array is configured by linearly mounting a plurality of image sensor ICs in the main-scan direction on the surface of the circuit board 5. The image sensor ICs include a plurality of light receiving elements (may also be called photoelectric conversion elements) that correspond to the resolution of reading by the image sensor unit 1. Thus, in the image sensor 7, a plurality of image sensor ICs (light receiving elements) are linearly arranged in the main-scan direction. The configuration of the image sensor 7 is not particularly limited as long as the configuration is one in which a plurality of image sensor ICs are linearly arranged. For example, a configuration may be adopted in which the image sensor ICs are arranged in a plurality of rows so as to form a staggered arrangement. The image sensor 7 and the image sensor ICs constituting the image sensor IC array can be various well-known image sensors and image sensor ICs.

The circuit board 5 has a rectangular structure that is long in the main-scan direction. The image sensor 7 and the light sources 6 are mounted on the upper surface of the circuit board 5. As illustrated in FIG. 8, the two light sources 6 are mounted in the vicinity of the ends in the main-scan direction of the circuit board 5, respectively, so as to be capable of emitting light towards the center in the main-scan direction. The image sensor 7 is mounted with a light receiving surface thereof facing upward so as to be capable of receiving light from the light condenser 4. Connectors for connecting wiring thereof with the outside are mounted on the circuit board 5.

In addition, an attachment portion for attaching to an image reading apparatus 10 (described later) or an image forming apparatus 50 (described later), and a connector for electrically connecting to the image reading apparatus 10 or the image forming apparatus 50 and the like are provided in the image sensor unit 1. The configurations of the attachment portion and the connector are not particularly limited. It is only necessary that the attachment portion has a configuration such that the image sensor unit can be attached to the image reading apparatus 10 and to the image forming apparatus 50. Further, it is only necessary that the connector has a configuration such that the image sensor unit 1 can be connected to a predetermined device among the image reading apparatus 10 and the image forming apparatus 50 to allow transmission and reception of power and electric signals.

As illustrated in FIG. 8 to FIG. 10, the light guide 3 to which the light guide cover 8 is attached is housed in the light guide housing chamber 27 of the frame 2. Consequently, the holding claws 21 provided in the frame 2 engage with the light guide cover 8. Therefore, the light guide 3 and the light guide cover 8 are held in a state in which the light guide 3 and the light guide cover 8 are housed in the light guide housing chamber 27. As illustrated in FIG. 10, a side surface of the light guide 3 is maintained in a state of contact with an inner circumferential face of the light guide housing chamber 27 by an urging force of the urging portion 83 of the light guide cover 8. Thus, the light guide 3 and the light guide cover 8 are positioned in the frame 2.

A configuration may also be adopted in which the image sensor unit 1 does not have the light guide cover 8. In such case, structures corresponding to the attachment portion 81, the attachment hole 811, and the engagement portion 812 of the light guide cover 8 are provided in the frame 2. Further, the holding claws 21 provided in the frame 2 directly fix the light guide 3 housed in the light guide housing chamber 27 to perform positioning thereof.

The light condenser 4 is housed in the light condenser housing chamber 28 of the frame 2. In addition, the circuit board 5 on which the light source 6 and the image sensor 7 are mounted is housed in the circuit board housing chamber 29.

When the light guide 3 is housed in the light guide housing chamber 27, and the circuit board 5 on which the two light sources 6 are mounted is housed in the circuit board housing chamber 29, the two light sources 6 face the light incident surfaces 31 formed at the two ends of the light guide 3, respectively (see FIG. 5). Accordingly, light emitted from the two light sources 6 enters the light incident surfaces 31 formed at the two ends of the light guide 3, respectively.

When emitting light to the original P, each of the light sources 6 turns on the light emitting elements of each color in sequence. The light emitted by the light source 6 enters the light guide 3 through the light incident surface 31, and propagates through the inside thereof by being reflected at the light diffusing surface 33 or another reflection surface. The light is emitted from the light emission surface 32 of the light guide 3 towards the reading line O of the original P. As illustrated in FIG. 10, in a state in which the image sensor unit 1 is incorporated into the image reading apparatus 10 or the image forming apparatus 50, an original supporting body 105 (described later) is arranged on the upper side of the image sensor unit 1. The illumination apparatus 9 of the image sensor unit 1 emits light towards the reading line O of the original P placed on the original supporting body 105. The light condenser 4 forms an image of the reflection light from the reading line O of the original P on the surface of the image sensor 7. The image sensor 7 converts an optical image formed by the light condenser 4 into electric signals.

The image sensor unit 1 performs the above described operation while relatively moving in the sub-scan direction with respect to the original P. It is thereby possible for the image sensor unit 1 to read the original P.

EXAMPLE

Figure 11:
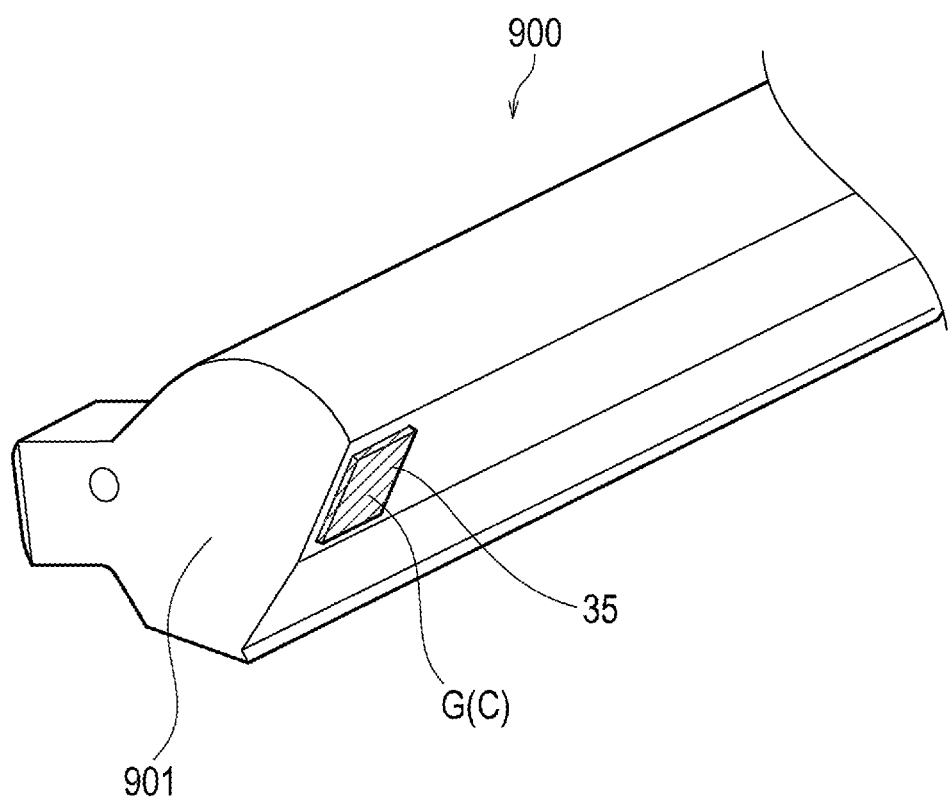
FIG. 11 is a perspective view that schematically illustrates a configuration of a light guide according to a comparative example.

Next, a verification result of the advantage of the embodiment of the present invention will be described. FIG. 11 is a perspective view that schematically illustrates the configuration of a light guide 900 according to a comparative example. As illustrated in FIG. 11, a light incident surface 901 is formed at an end in the main-scan direction (longitudinal direction) of the light guide 900 according to the comparative example. A gate portion G for injection molding is provided on a side surface at a position immediately next to the end in the main-scan direction. After formation by injection molding, the light guide 900 is detached by being cut with hot nippers or the like. Consequently, the surface of the gate-cut surface C is coarse in comparison to other portions due to projections and recesses arising on the surface thereof as a result of the cutting.

Figure 12:
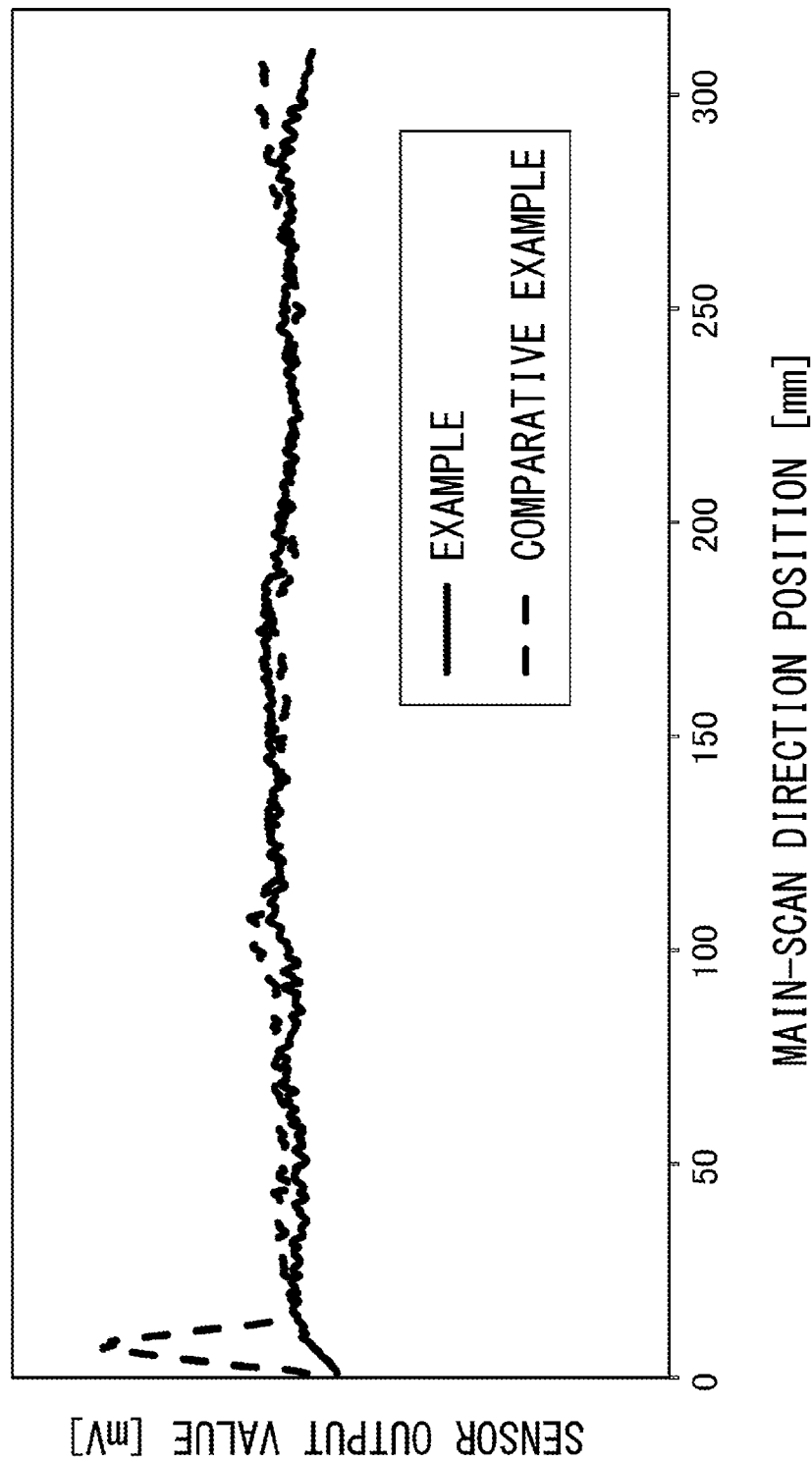
FIG. 12 is a graph showing luminance distributions in a main-scan direction of illumination light emitted by an illumination apparatus according to an example of the present invention and a comparative example.

FIG. 12 is a graph showing luminance distributions in a main-scan direction of illumination light emitted by an illumination apparatus of the example of the present invention and of a comparative example. In FIG. 12, a solid line indicates the example of the present invention, and a dashed line indicates the comparative example. The horizontal axis in the graph denotes a distance (main-scan direction position [mm]) from an end face of the light guides 3 and 900 (the light incident surfaces 31 and 901), and the vertical axis denotes the illuminance (sensor output value [mV]) of illumination light that is emitted. In the comparative example, the illuminance increases in the vicinity of the end (gate-cut surface C), and the luminance distribution of illumination light is nonuniform. It is considered that this is because the gate-cut surface C acts as a diffusing surface and produces diffused light, and also because light that is incident from the light incident surface 901 is emitted to outside from the gate-cut surface C (that is, due to leak light from the gate-cut surface C).

In contrast, in the example of the present invention, the variation of the illuminance of the illumination light in the vicinity of the ends in the main-scan direction is less than in the comparative example. This is because the gate portion G in the embodiment of the present invention is at the tip face 35 of the positioning portion 34, and hence the distance from the light source 6 increases in comparison to a case where the gate portion G is provided on the side surface at a position immediately next to the end of the light guide 900, and as a result a light distribution angle from the light source 6 increases compared to the comparative example. Consequently, it is considered that when using LEDs having a Lambert distribution in the light sources 6, the illuminance of light that arrives at the gate-cut surface C is less than in the comparative example, and diffused light from the gate-cut surface C and leak light emitted from the gate-cut surface C are reduced.

Thus, according to the example of the present invention it was confirmed that nonuniformity of the luminance distribution of illumination light that is caused by the gate-cut surface C can be prevented or suppressed.

Figure 13A:
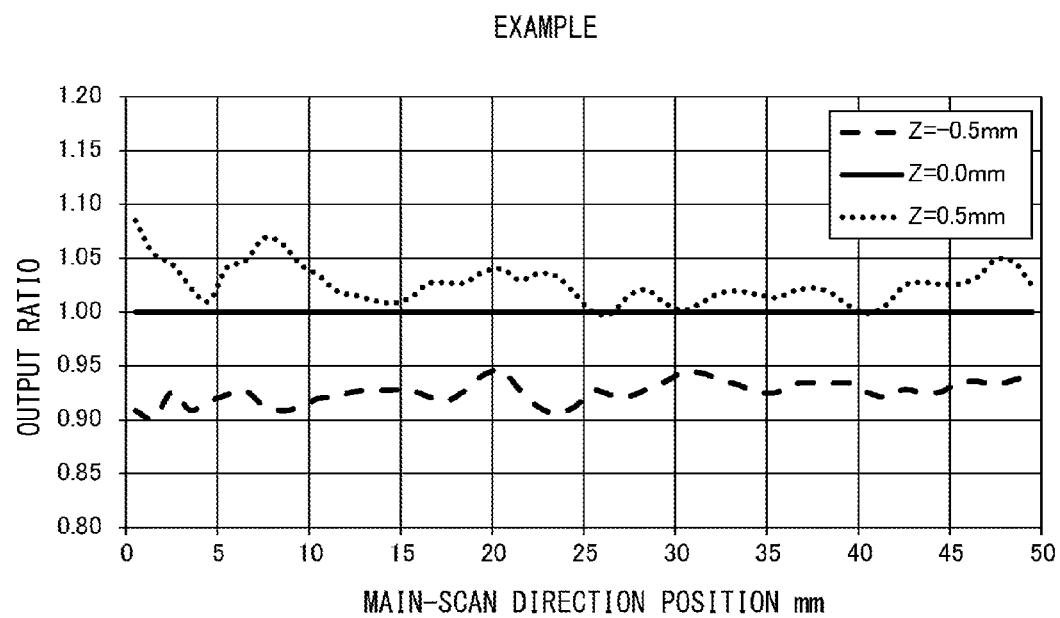
FIG. 13A is a graph showing illumination depth characteristics of the example of the present invention.
Figure 13B:
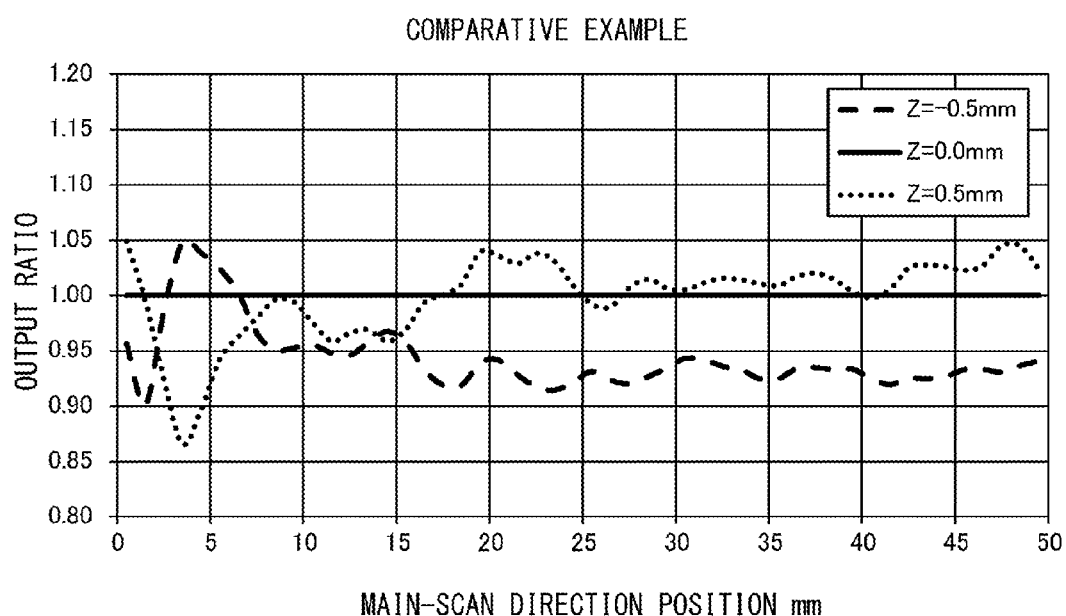
FIG. 13B is a graph showing illumination depth characteristics of the comparative example.

FIG. 13A and FIG. 13B are graphs that illustrate illumination depth characteristics of the example of the present invention and the comparative example. The term "illumination depth characteristics" refers to characteristics regarding the relationship between the position of the original P in the Z direction and the illuminance of the illumination light. FIG. 13A illustrates illumination depth characteristics of the example of the present invention, and FIG. 13B illustrates illumination depth characteristics of the comparative example. The horizontal axis in the graphs in both drawings indicates a distance from an end face of the light guides 3 and 900. The vertical axis in the graphs in both figures indicates values (output ratios) obtained by taking a position at which the original P is in close contact with the original supporting body 105 as a position where Z=0 mm, and dividing output values when the original P is at respective positions in the Z direction by the output value when the original P is at the position where Z=0 mm.

When reading the original P, in some cases the original P is in a state in which the original P has floated upward from the original supporting body 105 or in which the original P is pressed and the original supporting body 105 sinks and approaches the image sensor unit 1. Consequently, if the illumination depth characteristics are nonuniform with respect to the main-scan direction, lines with a high level of brightness and lines with a low level of brightness appear in a read image. In such case, there is a risk that the reading accuracy and the image quality will deteriorate. Therefore, with respect to the aforementioned output ratio, it is preferable that there are few variations throughout the whole length in the main-scan direction.

As illustrated in FIG. 13B, in the conventional example, in a state in which the original P has floated upward from the original supporting body 105 (Z=0.5 mm), the output value decreases locally in the vicinity of an end in the main-scan direction. In contrast, in a state in which the original P is close to the image sensor unit 1 (Z=−0.5 mm), the output value increases locally in the vicinity of an end in the main-scan direction. Accordingly, in these cases, lines with a high level of brightness or lines with a low level of brightness sometimes appear in a read original.

In contrast, as illustrated in FIG. 13A, according to the example, even in a state in which the original P has floated upward (Z=0.5 mm) or in a state in which the original P is close to the image sensor unit 1 (Z=−0.5 mm), a variation in the output value ratio throughout the whole length in the main-scan direction is small, and there are no local decreases or increases. Thus, according to the example of the present invention, it was confirmed that even if the position in the Z direction of the original P deviates from the original position thereof, a deterioration in the reading accuracy or image quality can be prevented or suppressed.

It is thus possible to make the illumination depth characteristics uniform, that is, to make the luminance distribution of illumination light with respect to the Z direction positions uniform.

(Image Reading Apparatus)

Figure 14:
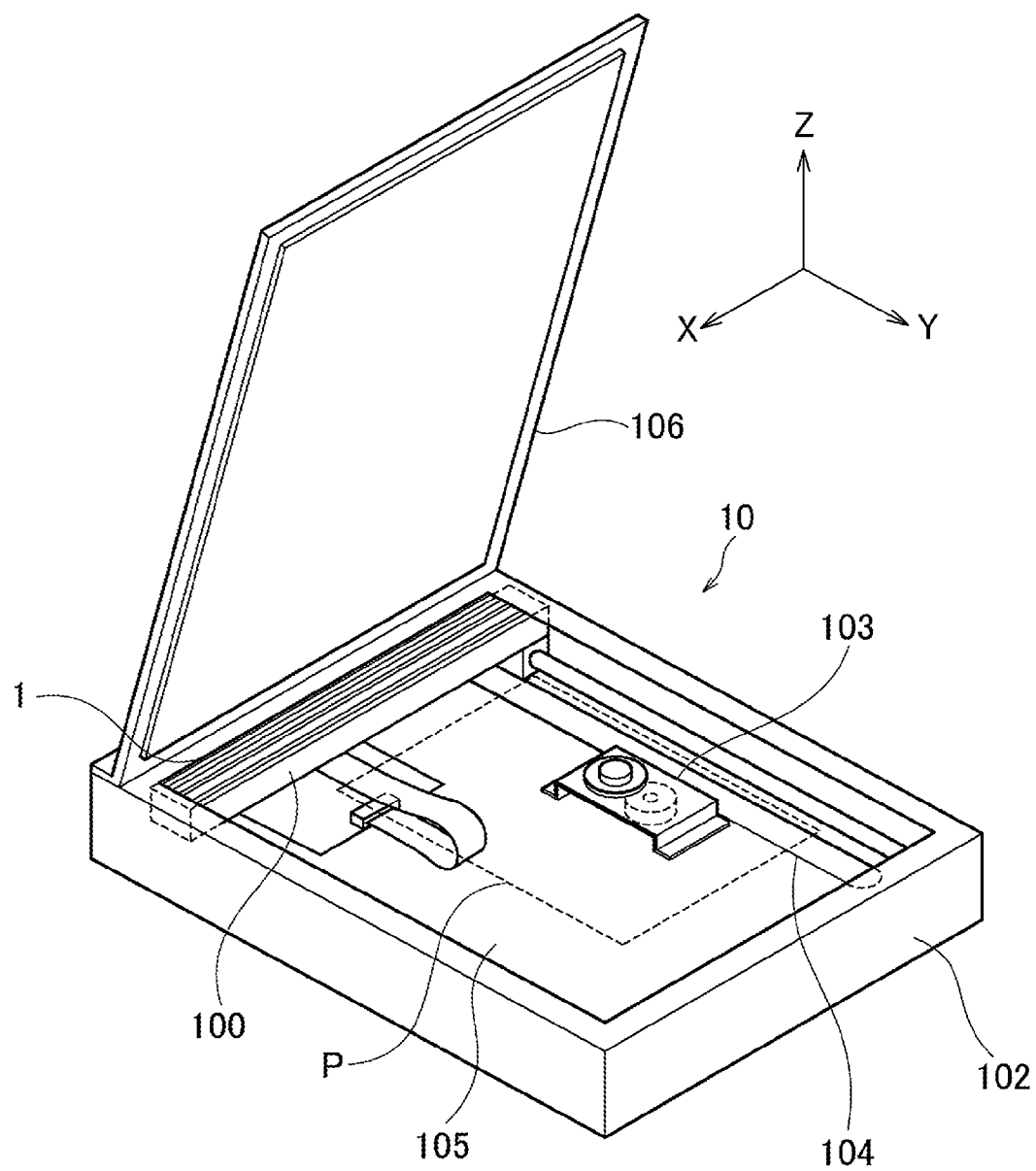
FIG. 14 is an external perspective view of an image reading apparatus that is an embodiment of the present invention.

Next, the image reading apparatus 10 that is an embodiment of the present invention will be described referring to FIG. 14. The image sensor unit 1 that is an embodiment of the present invention is applied to the image reading apparatus 10 that is an embodiment of the present invention. FIG. 14 is an external perspective view of the image reading apparatus 10 that is an embodiment of the present invention. As illustrated in FIG. 14, the image reading apparatus 10 that is an embodiment of the present invention is a flatbed-type scanner, and the image sensor unit 1 that is an embodiment of the present invention is incorporated in the image reading apparatus 10. The image reading apparatus 10 that is an embodiment of the present invention includes a housing 102, a unit table 100, and a unit table driving mechanism. The unit table 100 is a member on which the image sensor unit 1 that is an embodiment of the present invention can be mounted. The unit table driving mechanism is a mechanism for moving, in the sub-scan direction, the unit table 100 on which the image sensor unit 1 is mounted. For example, the unit table driving mechanism includes a drive motor 103, a wire 104 that transmits power of the drive motor 103 to the unit table 100, and a guide shaft 107 that guides the unit table 100. Configurations of the unit table 100 and the unit table driving mechanism are not particularly limited, and conventionally well-known configurations can be applied. The original supporting body 105 is provided on the upper surface of the housing 102. The original supporting body 105 can be a transparent glass plate, for example. A pressure plate 106 is further attached to an end of the housing 102 in the sub-scan direction through a hinge or the like, and the pressure plate 106 can be freely opened and closed. The pressure plate 106 has a function of holding the original P placed on an upper surface of the original supporting body 105.

Operation and usage of the image reading apparatus 10 that is an embodiment of the present invention are as follows. The original P is placed facing downward on the upper surface of the original supporting body 105, and the pressure plate 106 is closed. The drive motor 103 is driven to move the wire 104 to move the image sensor unit 1 in the sub-scan direction. At this time, the unit table 100 is guided by the guide shaft 107. As a result, the image sensor unit 1 moves relatively in the sub-scan direction with respect to the original P. While the image sensor unit 1 is moved, each reading line of the image of the original P is read. The image that is read by the image sensor unit 1 is subjected to image processing as required at a signal processing portion 109, and thereafter is stored as image data. Thus, reading of the original P is completed.

Since the image sensor unit 1 that is an embodiment of the present invention is applied to the image reading apparatus 10 that is an embodiment of the present invention, the luminance distribution of illumination light that is emitted to the original P can be made uniform.

The parts of the image reading apparatus 10 that is an embodiment of the present invention whose description has been omitted can be configured the same as those of known conventional image reading apparatuses.

Further, although a flatbed-type scanner has been described as the image reading apparatus 10, the image reading apparatus can also be a sheet-feed type image scanner.

(Image Forming Apparatus)

Figure 15:
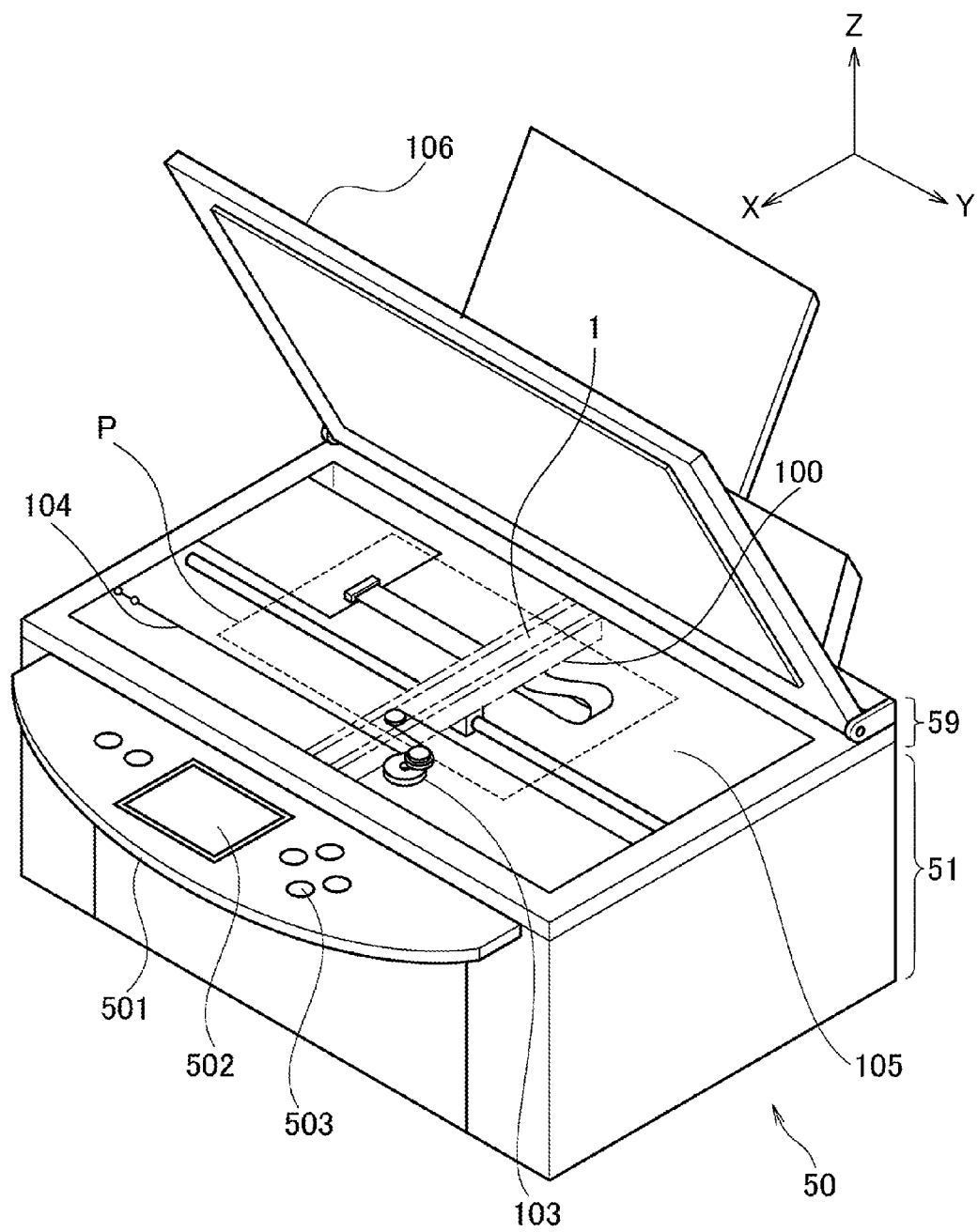
FIG. 15 is an external perspective view of an image forming apparatus that is an embodiment of the present invention.
Figure 16:
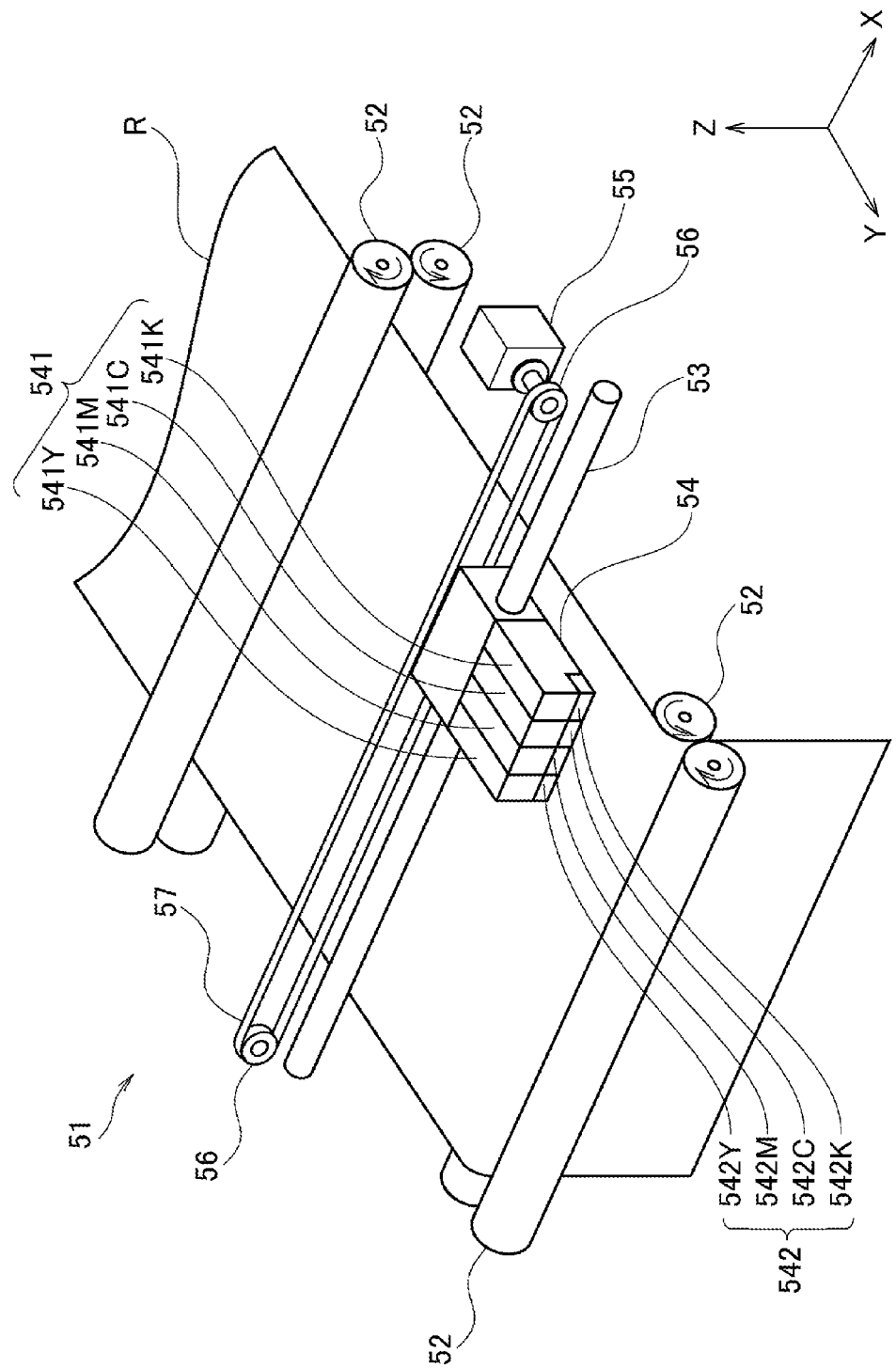
FIG. 16 is a perspective view illustrating an image forming portion provided in a housing of the image forming apparatus that is an embodiment of the present invention.

Next, the image forming apparatus 50 that is an embodiment of the present invention is described referring to FIG. 15 and FIG. 16. The image sensor unit 1 that is an embodiment of the present invention is applied to the image forming apparatus 50 that is an embodiment of the present invention. FIG. 15 is an external perspective view of the image forming apparatus 50 that is an embodiment of the present invention. FIG. 16 is a perspective view illustrated by extracting an image forming portion 51 provided in a housing of the image forming apparatus 50 that is an embodiment of the present invention. As illustrated in FIG. 15 and FIG. 16, the image forming apparatus 50 is a compound machine (MFP: multifunction printer) of a flat-bed type scanner and an inkjet printer, and includes an image reading portion 59 as image reading means that reads an image and the image forming portion 51 as image forming means that forms an image. The image sensor unit 1 that is an embodiment of the present invention is incorporated into the image reading portion 59 of the image forming apparatus 50. Configurations common to those of the image reading apparatus 10 described above can be applied to the image reading portion 59 of the image forming apparatus 50. Therefore, the configurations common to those of the image reading apparatus 10 are designated with the same reference numerals, and the description will not be repeated.

As illustrated in FIG. 15, an operation portion 501 is provided on the image forming apparatus 50. The operation portion 501 includes: a display portion 502 that displays an operation menu, various messages, and the like; and various operation buttons 503 for operating the image forming apparatus 50.

As illustrated in FIG. 16, the image forming portion 51 is provided in the housing 504 of the image forming apparatus 50. The image forming portion 51 includes conveyor rollers 52, a guide shaft 53, an inkjet cartridge 54, a motor 55, and a pair of timing pulleys 56. The conveyor rollers 52, rotated by driving force of a driving source, convey printing paper R as a recording medium in the sub-scan direction. The guide shaft 53 is a rod-like member and is fixed in the housing of the image forming apparatus 50 so that the axis line is parallel to the main-scan direction of the printing paper R. The inkjet cartridge 54 can slide over the guide shaft 53 to move back and forth in the main-scan direction of the printing paper R. The inkjet cartridge 54 includes, for example, ink tanks 541 (541C, 541M, 541Y, and 541K) with cyan C, magenta M, yellow Y, and black K inks and discharge heads 542 (542C, 542M, 542Y, and 542K) arranged on the ink tanks 541, respectively. One of the pair of timing pulleys 56 is attached to a rotating shaft of the motor 55. The pair of timing pulleys 56 are provided at positions apart from each other in the main-scan direction of the printing paper R. A timing belt 57 is wound around the pair of timing pulleys 56 in parallel with the pair of timing pulleys 56, and a predetermined section is coupled to the inkjet cartridge 54.

The image reading portion 59 of the image forming apparatus 50 converts an image read by the image sensor unit 1 to an electric signal in a form that is suitable for printing. The image forming portion 51 of the image forming apparatus 50 drives the conveyor rollers 52, the motor 55, and the inkjet cartridge 54 based on the electric signal converted by the image sensor unit 1 of the image reading portion 59 and forms an image on the printing paper R. In addition, the image forming portion 51 of the image forming apparatus 50 can form an image based on an electric signal input from the outside. The same configurations as those of various well-known printers can be applied to the configurations and operation of the image forming portion 51 in the image forming apparatus 50. Therefore, the details will not be described.

The image sensor unit 1 that is an embodiment of the present invention is applied to the image reading portion 59 in the image forming apparatus 50 according to an embodiment of the present invention. Therefore, the luminance distribution of illumination light that is emitted to the original P can be made uniform.

Although various embodiments of the present invention have been described in detail above, the embodiments described above are just specific examples for carrying out the present invention. The technical scope of the present invention is not limited to the above described embodiments. Various changes can be made to the present invention without departing from the spirit of the present invention.

For example, the image reading apparatus according to the present invention is not limited to the image scanner with the configuration described in the embodiments. The image forming apparatus is not limited to the inkjet type, and any type, such as an electrophotographic type, a thermal transfer type, and a dot impact type, is possible. The image forming apparatus is not limited to the compound machine described in the embodiments. A copying machine or a facsimile to which the image sensor unit according to the present invention is applied are also included in the image reading apparatus of the present invention.

Although the illumination apparatus including the light sources 6 and the light guide 3 is used as a reflection reading light source for the original P, the illumination apparatus may be used as a transmission reading light source.

The present invention can be effectively used for an image sensor unit, and an image reading apparatus or an image forming apparatus (for example, an image scanner, a facsimile, a copying machine, or a compound machine) to which the image sensor unit is applied.

According to the present invention, the luminance distribution of illumination light that is emitted through a light guide can be made uniform.

It should be noted that the above embodiments merely illustrate concrete examples of implementing the present invention, and the technical scope of the present invention is not to be construed in a restrictive manner by these embodiments. That is, the present invention may be implemented in various forms without departing from the technical spirit or main features thereof.

What is claimed is:

1. An illumination apparatus, comprising:
   a light guide that is formed in a rod shape, and that includes a positioning portion that is formed at one end in a longitudinal direction thereof, and light incident surfaces that are formed at one or two end faces in the longitudinal direction; and
   one or two light sources that are arranged adjacent to said positioning portion, respectively, and that emit light that is incident on said light incident surfaces;
   wherein:
   said light guide is formed by injection molding;
   a gate portion that is formed at a position into which a resin material flows during injection molding is provided at a tip face of said positioning portion; and
   said gate portion has projections and recesses.

2. The illumination apparatus according to claim 1, wherein said positioning portion and said light incident surfaces are formed at the same one end in a longitudinal direction of said light guide.

3. The illumination apparatus according to claim 1, wherein said positioning portion protrudes in a perpendicular direction with respect to a longitudinal direction of said light guide.

4. The illumination apparatus according to claim 1, wherein said projections and recesses are formed by gate-cutting.

5. The illumination apparatus according to claim 1, further comprising a light guide cover that is attached to said light guide, wherein the light guide cover has an engagement portion that is positioned in said light guide by engagement between said engagement portion and said positioning portion of said light guide.

6. The illumination apparatus according to claim 5, wherein said light guide is provided with a light diffusing surface that diffuses light incident from said light incident surfaces, and said light guide cover is provided with a light reflection surface that covers said light diffusing surface and reflects light emitted from said light diffusing surface.

7. The illumination apparatus according to claim 5, wherein said engagement portion is formed in a shape of a concave portion in which an end side at which said positioning portion of said light guide in a longitudinal direction is provided and one side in a sub-scan direction are open.

8. An image sensor unit, comprising:
   a light guide that is formed in a rod shape, and that includes a positioning portion that is formed at one end in a longitudinal direction thereof, and light incident surfaces that are formed at one or two end faces in the longitudinal direction;
   one or two light sources that are arranged adjacent to said positioning portion, respectively, and that emit light that is incident on said light incident surfaces;
   a light condenser that focuses reflection light from an object of illumination;
   an image sensor that receives reflection light that is focused by said light condenser, and converts the reflection light into an electric signal;
   a circuit board on which said image sensor is mounted; and
   a frame that supports said light guide, said one or two light sources, said light condenser, and said circuit board;
   wherein:
   said light guide is formed by injection molding;
   a gate portion that is formed at a position into which a resin material flows during injection molding is provided at a tip face of said positioning portion; and
   said gate portion has projections and recesses.

9. An image sensor unit, comprising:
   a light guide that is formed in a rod shape, and that includes a positioning portion that is formed at one end in a longitudinal direction thereof, and light incident surfaces that are formed at one or two end faces in the longitudinal direction;
   a light guide cover that is attached to said light guide, and that is positioned in said light guide by engagement between said engagement portion and said positioning portion;
   one or two light sources that are arranged adjacent to said positioning portion, respectively, and that emit light that is incident on said light incident surfaces;
   a light condenser that focuses reflection light from an object of illumination;
   an image sensor that receives reflection light that is focused by said light condenser, and converts the reflection light into an electric signal;
   a circuit board on which said image sensor is mounted; and
   a frame that supports said light guide cover, said one or two light sources said light condenser, and said circuit board;
   wherein:
   said light guide is formed by injection molding;
   a gate portion that is formed at a position into which a resin material flows during injection molding is provided at a tip face of said positioning portion; and
   said gate portion has projections and recesses.

10. An image reading apparatus having an image sensor unit, the unit comprising:
    a light guide that is formed in a rod shape, and that includes a positioning portion that is formed at one end in a longitudinal direction thereof, and light incident surfaces that are formed at one or two end faces in the longitudinal direction;
    one or two light sources that are arranged adjacent to said positioning portion, respectively, and that emit light that is incident on said light incident surfaces;

a light condenser that focuses reflection light from an object of illumination;
an image sensor that receives reflection light that is focused by said light condenser, and converts the reflection light into an electric signal;
a circuit board on which said image sensor is mounted; and
a frame that supports said light guide, said one or two light sources, said light condenser, and said circuit board;
wherein:
said light guide is formed by injection molding;
a gate portion that is formed at a position into which a resin material flows during injection molding is provided at a tip face of said positioning portion; and
said gate portion has projections and recesses.

* * * * *